United States Patent
Lin et al.

(10) Patent No.: US 8,022,546 B2
(45) Date of Patent: Sep. 20, 2011

(54) TOP LAYERS OF METAL FOR HIGH PERFORMANCE IC'S

(75) Inventors: Mou-Shiung Lin, Hsin-Chu (TW); Jin-Yuan Lee, Hsin-Chu (TW)

(73) Assignee: Megica Corporation, Hsinchu (TW)

( * ) Notice: Subject to any disclaimer, the term of this patent is extended or adjusted under 35 U.S.C. 154(b) by 54 days.

(21) Appl. No.: 12/138,453

(22) Filed: Jun. 13, 2008

(65) Prior Publication Data

US 2008/0246154 A1    Oct. 9, 2008

Related U.S. Application Data

(63) Continuation of application No. 10/154,662, filed on May 24, 2002, now Pat. No. 7,405,149.

(51) Int. Cl.
*H01L 23/522* (2006.01)

(52) U.S. Cl. ............................ 257/758; 257/E23.142

(58) Field of Classification Search .............. 257/690, 257/700, 750, 758–760, 780, 781, 784, E23.019, 257/E23.142

See application file for complete search history.

(56) References Cited

U.S. PATENT DOCUMENTS

| | | |
|---|---|---|
| 4,188,636 A | 2/1980 | Sato |
| 4,423,547 A | 1/1984 | Farrar et al. |
| 4,618,878 A | 10/1986 | Aoyama et al. |
| 4,685,998 A | 8/1987 | Quinn et al. |
| 4,789,647 A | 12/1988 | Peters |
| 4,980,034 A | 12/1990 | Volfson |
| 5,046,161 A | 9/1991 | Takada |
| 5,055,907 A | 10/1991 | Jacobs |
| 5,061,985 A | 10/1991 | Meguro et al. |
| 5,083,187 A | 1/1992 | Lamson et al. |
| 5,106,461 A | 4/1992 | Volfson et al. |
| 5,120,572 A | 6/1992 | Kumar |
| 5,179,448 A | 1/1993 | Steinhardt |
| 5,212,403 A | 5/1993 | Nakanishi et al. |
| 5,226,232 A | 7/1993 | Boyd |
| 5,227,013 A | 7/1993 | Kumar |
| 5,244,833 A | 9/1993 | Gansauge et al. |
| 5,262,353 A | 11/1993 | Sun |

(Continued)

FOREIGN PATENT DOCUMENTS

JP          01-135043           5/1989

(Continued)

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

(Continued)

*Primary Examiner* — Marcos D. Pizarro
(74) *Attorney, Agent, or Firm* — McDermott Will & Emery, LLP

(57) ABSTRACT

The present invention adds one or more thick layers of polymer dielectric and one or more layers of thick, wide metal lines on top of a finished semiconductor wafer, post-passivation. The thick, wide metal lines may be used for long signal paths and can also be used for power buses or power planes, clock distribution networks, critical signal, and re-distribution of I/O pads for flip chip applications. Photoresist defined electroplating, sputter/etch, or dual and triple damascene techniques are used for forming the metal lines and via fill.

24 Claims, 22 Drawing Sheets

U.S. PATENT DOCUMENTS

| | | |
|---|---|---|
| 5,360,524 A | 11/1994 | Hendel |
| 5,384,488 A | 1/1995 | Golshan et al. |
| 5,436,412 A | 7/1995 | Ahmad et al. |
| 5,468,984 A | 11/1995 | Efland et al. |
| 5,501,006 A | 3/1996 | Gehman, Jr. et al. |
| 5,532,512 A | 7/1996 | Fillion et al. |
| 5,563,085 A | 10/1996 | Kohyama |
| 5,563,086 A | 10/1996 | Bertin |
| 5,635,767 A | 6/1997 | Wenzel et al. |
| 5,659,201 A | 8/1997 | Wollesen |
| 5,665,989 A | 9/1997 | Dangelo |
| 5,686,764 A | 11/1997 | Fulcher |
| 5,691,248 A | 11/1997 | Cronin et al. |
| 5,719,448 A | 2/1998 | Ichikawa |
| 5,726,499 A | 3/1998 | Irinoda |
| 5,767,010 A | 6/1998 | Mis et al. |
| 5,773,888 A | 6/1998 | Hosomi et al. |
| 5,783,483 A | 7/1998 | Gardner |
| 5,789,303 A | 8/1998 | Leung |
| 5,792,594 A | 8/1998 | Brown et al. |
| 5,818,110 A | 10/1998 | Cronin et al. |
| 5,827,776 A | 10/1998 | Bandyopadhyay et al. |
| 5,827,778 A | 10/1998 | Yamada |
| 5,834,844 A | 11/1998 | Akagawa et al. |
| 5,854,513 A | 12/1998 | Kim |
| 5,861,675 A | 1/1999 | Sasaki |
| 5,883,435 A | 3/1999 | Geffken et al. |
| 5,892,273 A | 4/1999 | Iwasaki et al. |
| 5,910,020 A | 6/1999 | Yamada |
| 5,937,320 A | 8/1999 | Andricacos |
| 5,939,790 A | 8/1999 | Gregoire |
| 5,952,726 A | 9/1999 | Liang |
| 5,953,626 A | 9/1999 | Hause et al. |
| 5,965,903 A | 10/1999 | Chittipeddi |
| 5,969,424 A | 10/1999 | Matsuki et al. |
| 5,994,766 A | 11/1999 | Shenoy et al. |
| 6,001,538 A | 12/1999 | Chen et al. |
| 6,011,314 A | 1/2000 | Leibovitz et al. |
| 6,016,000 A | 1/2000 | Moslehi |
| 6,020,640 A | 2/2000 | Efland et al. |
| 6,022,792 A | 2/2000 | Ishii et al. |
| 6,025,275 A | 2/2000 | Efland |
| 6,025,639 A | 2/2000 | Mitwalsky |
| 6,066,877 A | 5/2000 | Williams et al. |
| 6,075,290 A | 6/2000 | Schaefer et al. |
| 6,077,726 A | 6/2000 | Mistry et al. |
| 6,087,250 A | 7/2000 | Hyakutake |
| 6,100,548 A | 8/2000 | Nguyen et al. |
| 6,103,552 A | 8/2000 | Lin |
| 6,121,159 A | 9/2000 | Pasch |
| 6,124,198 A | 9/2000 | Moslehi |
| 6,130,457 A | 10/2000 | Yu et al. |
| 6,130,481 A | 10/2000 | Harada |
| 6,144,100 A | 11/2000 | Shen et al. |
| 6,146,985 A | 11/2000 | Wollesen |
| 6,153,521 A | 11/2000 | Cheung |
| 6,174,810 B1 | 1/2001 | Islam |
| 6,184,138 B1 | 2/2001 | Ho |
| 6,184,143 B1 | 2/2001 | Ohashi et al. |
| 6,187,680 B1 | 2/2001 | Costrini et al. |
| 6,207,486 B1 | 3/2001 | Nishiyama |
| 6,218,223 B1 | 4/2001 | Ikeda |
| 6,218,318 B1 | 4/2001 | Ohkura |
| 6,229,221 B1 | 5/2001 | Kloen et al. |
| 6,242,336 B1 | 6/2001 | Ueda |
| 6,272,736 B1 | 8/2001 | Lee |
| 6,288,447 B1 | 9/2001 | Amishiro et al. |
| 6,294,451 B1 | 9/2001 | Yoshizawa |
| 6,300,234 B1 | 10/2001 | Flynn |
| 6,303,977 B1 | 10/2001 | Schroen |
| 6,330,234 B1 | 12/2001 | Tomasi et al. |
| 6,346,471 B1 | 2/2002 | Okushima |
| 6,348,733 B1 | 2/2002 | Lin |
| 6,350,705 B1 | 2/2002 | Lin |
| 6,359,328 B1 | 3/2002 | Dubin |
| 6,362,087 B1 | 3/2002 | Wang et al. |
| 6,370,768 B1 | 4/2002 | Itabashi |
| 6,376,374 B1 | 4/2002 | Stevens |
| 6,383,916 B1 | 5/2002 | Lin |
| 6,392,300 B1 | 5/2002 | Koike |
| 6,410,435 B1 | 6/2002 | Ryan |
| 6,417,575 B2 | 7/2002 | Harada et al. |
| 6,429,120 B1 | 8/2002 | Ahn et al. |
| 6,436,814 B1 | 8/2002 | Horak |
| 6,455,885 B1 | 9/2002 | Lin |
| 6,459,135 B1 | 10/2002 | Basteres et al. |
| 6,472,745 B1 | 10/2002 | Iizuka |
| 6,489,647 B1 | 12/2002 | Lin |
| 6,495,442 B1 | 12/2002 | Lin et al. |
| 6,518,092 B2 | 2/2003 | Kikuchi |
| 6,538,326 B2 | 3/2003 | Shimizu et al. |
| 6,544,880 B1 | 4/2003 | Akram |
| 6,555,459 B1 | 4/2003 | Tokushige et al. |
| 6,578,754 B1 | 6/2003 | Tung |
| 6,583,043 B2 | 6/2003 | Shroff |
| 6,593,222 B2 | 7/2003 | Smoak |
| 6,593,649 B1 | 7/2003 | Lin et al. |
| 6,605,524 B1 | 8/2003 | Fan et al. |
| 6,605,528 B1 | 8/2003 | Lin et al. |
| 6,605,549 B2 | 8/2003 | Leu et al. |
| 6,614,091 B1 | 9/2003 | Downey et al. |
| 6,620,728 B2 | 9/2003 | Lin |
| 6,639,299 B2 | 10/2003 | Aoki |
| 6,646,347 B2 | 11/2003 | Mercado et al. |
| 6,649,509 B1 | 11/2003 | Lin et al. |
| 6,653,563 B2 | 11/2003 | Bohr |
| 6,660,728 B2 | 12/2003 | Scheunemann |
| 6,673,704 B2 | 1/2004 | Wada |
| 6,680,544 B2 | 1/2004 | Lu et al. |
| 6,683,380 B2 | 1/2004 | Efland |
| 6,707,124 B2 | 3/2004 | Wachtler et al. |
| 6,707,159 B1 | 3/2004 | Kumamoto et al. |
| 6,709,973 B1 | 3/2004 | Sakamoto |
| 6,710,460 B2 | 3/2004 | Morozumi |
| 6,713,381 B2 | 3/2004 | Barr et al. |
| 6,720,212 B2 | 4/2004 | Robl |
| 6,756,295 B2 | 6/2004 | Lin et al. |
| 6,762,115 B2 | 7/2004 | Lin |
| 6,780,748 B2 | 8/2004 | Yamaguchi et al. |
| 6,798,050 B1 | 9/2004 | Homma et al. |
| 6,798,073 B2 | 9/2004 | Lin |
| 6,800,555 B2 | 10/2004 | Test et al. |
| 6,818,540 B2 | 11/2004 | Saran et al. |
| 6,818,546 B2 | 11/2004 | Saito |
| 6,826,517 B2 | 11/2004 | Okada |
| 6,838,769 B1 | 1/2005 | Chittipeddi |
| 6,844,631 B2 | 1/2005 | Yong et al. |
| 6,847,006 B2 | 1/2005 | Yamazaki |
| 6,847,066 B2 | 1/2005 | Tahara |
| 6,861,740 B2 | 3/2005 | Hsu |
| 6,864,562 B1 | 3/2005 | Toyosawa |
| 6,894,399 B2 | 5/2005 | Vu |
| 6,900,541 B1 | 5/2005 | Wang |
| 6,900,545 B1 | 5/2005 | Sebesta et al. |
| 6,943,101 B2 | 9/2005 | Brintzinger |
| 6,943,440 B2 | 9/2005 | Kim et al. |
| 6,963,136 B2 | 11/2005 | Shinozaki et al. |
| 6,979,647 B2 | 12/2005 | Bojkov et al. |
| 7,091,616 B2 | 8/2006 | Suminoe |
| 7,239,028 B2 | 7/2007 | Anzai |
| 7,355,282 B2 | 4/2008 | Lin |
| 7,405,149 B1 | 7/2008 | Lin |
| 2001/0035452 A1 | 11/2001 | Test |
| 2001/0051426 A1 | 12/2001 | Pozder et al. |
| 2002/0000671 A1 | 1/2002 | Zuniga et al. |
| 2002/0024142 A1 | 2/2002 | Sekiguchi |
| 2002/0043723 A1 | 4/2002 | Shimizu et al. |
| 2002/0158334 A1 | 10/2002 | Vu et al. |
| 2003/0102551 A1 | 6/2003 | Kikuchi |
| 2003/0218246 A1 | 11/2003 | Abe et al. |
| 2004/0023450 A1 | 2/2004 | Katagiri et al. |
| 2006/0063371 A1 | 3/2006 | Lin |
| 2006/0063378 A1 | 3/2006 | Lin |
| 2008/0246154 A1 | 10/2008 | Lin |

FOREIGN PATENT DOCUMENTS

| | | | | |
|---|---|---|---|---|
| JP | 01135043 | A | * | 5/1989 |
| JP | 01-183836 | | | 7/1989 |
| JP | 01-184848 | | | 7/1989 |
| JP | 01-184849 | | | 7/1989 |
| JP | 01184849 | A | * | 7/1989 |
| JP | 04-316351 | | | 6/2008 |

OTHER PUBLICATIONS

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects On Power Supply Clamps," Proceedings of the 6th International Sympoisum on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/Silk™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnects for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology-High Q Post Passivation Inductors," Proceedings from the 53rd Electronic Components and Technology Conference (May 30, 2003) pp. 1503-1509.

Megic Corp. "MEGIC way to system solutions through bumping and redistribution," (Brochure) (Feb. 6, 2004) pp. 1-3.

Lin, M.S. "Post Passivation Technology™ -MEGIC ® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost-Post Passivation Interconnection," Proceedings of the IEEE Custom Integrated Circuits Conference (Sep. 24, 2003) pp. 533-536.

Wolf, Stanley: "Process Integration", Silicon Processing for the VLSI Era, vol. 2, Lattice Press, Sunset Beach, CA, pp. 214-285.

* cited by examiner

TOP LAYERS OF METAL FOR HIGH PERFORMANCE IC'S

This application is a continuation of application Ser. No. 10/154,662, filed on May 24, 2002, now pending.

BACKGROUND OF THE INVENTION (1) Field of the Invention

The invention relates to the manufacturing of high performance Integrated Circuit (IC's), and more specifically to methods of achieving high performance of the Integrated Circuits by reducing the parasitic capacitance and resistance of interconnecting wiring on chip.

(2) Description of the Prior Art

When the geometric dimensions of the Integrated Circuits are scaled down, the cost per die is decreased while some aspects of performance are improved. The metal connections which connect the Integrated Circuit to other circuit or system components become of relative more importance and have, with the further miniaturization of the IC, an increasingly negative impact on the circuit performance. The parasitic capacitance and resistance of the metal interconnections increase, which degrades the chip performance significantly. Of most concern in this respect is the voltage drop along the power and ground buses and the RC delay of the critical signal paths. Attempts to reduce the resistance by using wider metal lines result in higher capacitance of these wires.

To solve this problem, the approach has been taken to develop low resistance metal (such as copper) for the wires while low dielectric materials are used in between signal lines. Increased Input-Output (IO) combined with increased demands for high performance IC's has led to the development of Flip Chip Packages. Flip-chip technology fabricates bumps (typically Pb/Sn solders) on Al pads on chip and interconnect the bumps directly to the package media, which are usually ceramic or plastic based. The flip-chip is bonded face down to the package medium through the shortest path. These technologies can be applied not only to single-chip packaging, but also to higher or integrated levels of packaging in which the packages are larger and to more sophisticated substrates that accommodate several chips to form larger functional units.

The flip-chip technique, using an area array, has the advantage of achieving the highest density of interconnection to the device and a very low inductance interconnection to the package. However, pre-testability, post-bonding visual inspection, and TCE (Temperature Coefficient of Expansion) matching to avoid solder bump fatigue are still challenges. In mounting several packages together, such as surface mounting a ceramic package to a plastic board, the TCE mismatch can cause a large thermal stress on the solder-lead joints that can lead to joint breakage caused by solder fatigue from temperature cycling operations.

U.S. Pat. No. 5,212,403 (Nakanishi) shows a method of forming wiring connections both inside and outside (in a wiring substrate over the chip) for a logic circuit depending on the length of the wire connections.

U.S. Pat. No. 5,501,006 (Gehman, Jr. et al.) shows a structure with an insulating layer between the integrated circuit (IC) and the wiring substrate. A distribution lead connects the bonding pads of the IC to the bonding pads of the substrate.

U.S. Pat. No. 5,055,907 (Jacobs) discloses an extended integration semiconductor structure that allows manufacturers to integrate circuitry beyond the chip boundaries by forming a thin film multi-layer wiring decal on the support substrate and over the chip. However, this reference differs from the invention.

U.S. Pat. No. 5,106,461 (Volfson et al.) teaches a multi layer interconnect structure of alternating polyimide (dielectric) and metal layers over an IC in a TAB structure.

U.S. Pat. No. 5,635,767 (Wenzel et al.) teaches a method for reducing RC delay by a PBGA that separates multiple metal layers.

U.S. Pat. No. 5,686,764 (Fulcher) shows a flip chip substrate that reduces RC delay by separating the power and I/O traces.

SUMMARY OF THE INVENTION

It is the primary objective of the present invention to improve the performance of High Performance Integrated Circuits.

Another objective of the present invention is to reduce resistive voltage drop of the power supply lines that connect the IC to surrounding circuitry or circuit components.

Another objective of the present invention is to reduce the RC delay constant of the signal paths of high performance IC's.

Yet another objective of the present invention is to facilitate the application of IC's of reduced size and increased circuit density.

Yet another objective of the present invention is to further facilitate and enhance the application of low resistor conductor metals.

Yet another objective of the present invention is to allow for increased I/O pin count for the use of high performance IC's.

Yet another objective of the present invention is to simplify chip assembly by reducing the need for re-distribution of I/O chip connections.

Yet another objective of the present invention is to facilitate the connection of high-performance IC's to power buses.

Yet another objective of the present invention is to facilitate the connection of high-performance IC's to clock distribution networks.

Yet another objective of the present invention is to reduce IC manufacturing costs by allowing or facilitating the use of less expensive process equipment and by accommodating less strict application of clean room requirements, this as compared to sub-micron manufacturing requirements.

Yet another objective of the present invention is to be a driving force and stimulus for future system-on-chip designs since the present invention allows ready and cost effective interconnection between functional circuits that are positioned at relatively large distances from each other on the chip.

Yet another objective of the present design is to form the basis for a computer based routing tool that automatically routes interconnections that exceed a pre-determined length in accordance with the type of interconnection that needs to be established.

The present invention adds one or more thick layers of polymer dielectric and one or more layers of thick, wide metal lines on top of the finished device wafer passivation. The thick layer of dielectric can, for example, be of polyimide or benzocyclobutene (BCB) with a thickness of over, for example, 3 micrometers. The wide metal lines can, for instance, be of electroplated copper or gold. These layers of dielectric and metal lines are of primary benefit for long signal paths and can also be used for power buses or power planes, clock distribution networks, critical signal, re-distribution of I/O pads for flip chip applications. Single, dual and triple damascene techniques, or combinations thereof, are used for forming the metal lines and via fill.

Furthermore, a method for forming a post-passivation, top metallization system for high performance integrated circuits is provided. An integrated circuit is provided, having devices formed in and on a semiconductor substrate. An overlaying fine line interconnecting metallization structure with first metal lines is connected to the devices, and has a passivation layer formed thereover, with first openings in the passivation layer to contact pads connected to the first metal lines. A top metallization system is formed above the passivation layer, connected to the interconnecting metallization structure, wherein the top metallization system has top metal lines, in one or more layers, having a width substantially greater than the first metal lines, and wherein the top metallization system connects portions of the interconnecting metallization structure to other portions of the interconnecting metallization structure.

DETAILED DESCRIPTION OF THE INVENTION

The present invention teaches an Integrated Circuit structure where key re-distribution and interconnection metal layers and dielectric layers are added over a conventional IC. These re-distribution and interconnection layers allow for wider buses and reduce conventional RC delay.

Figure 1A:
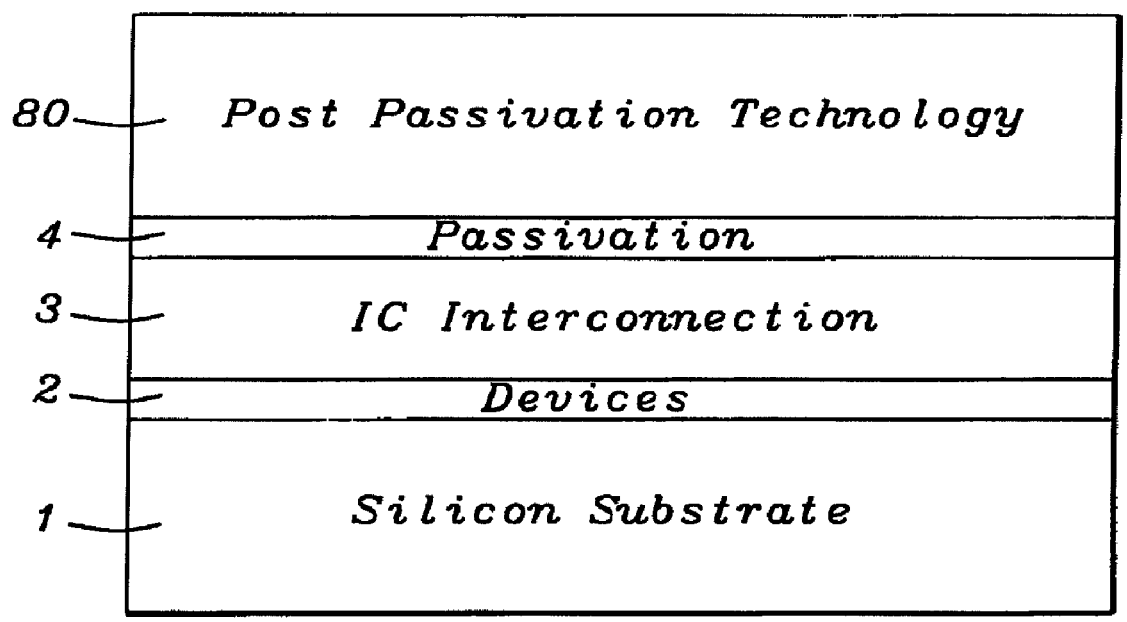
FIGS. 1a-1b show a cross section of the interconnection scheme of the present invention.

FIG. 1a shows a cross-sectional representation of a general view of the invention. Devices 2 are formed in and on a semiconductor substrate 1, and metallization is accomplished in one or more layers of IC Interconnection 3, above the device layer. The IC interconnection connects the devices to one another to form operational circuits, and also has in its top layer of metal points of electrical contact (such as bond pads), which provide connections from the IC interconnection layer to outside of the IC. A passivation layer 4 covers the IC interconnection scheme, while providing openings to the electrical contact points.

In a key aspect of the invention, the passivation openings can be as small as 0.1 micrometers. In another critical aspect of the invention, various methods are used to form the Post Passivation Technology segment 80, in which metal lines which are formed substantially thicker and wider than those in the IC Interconnection layer. More detail is provided below.

Figure 1B:
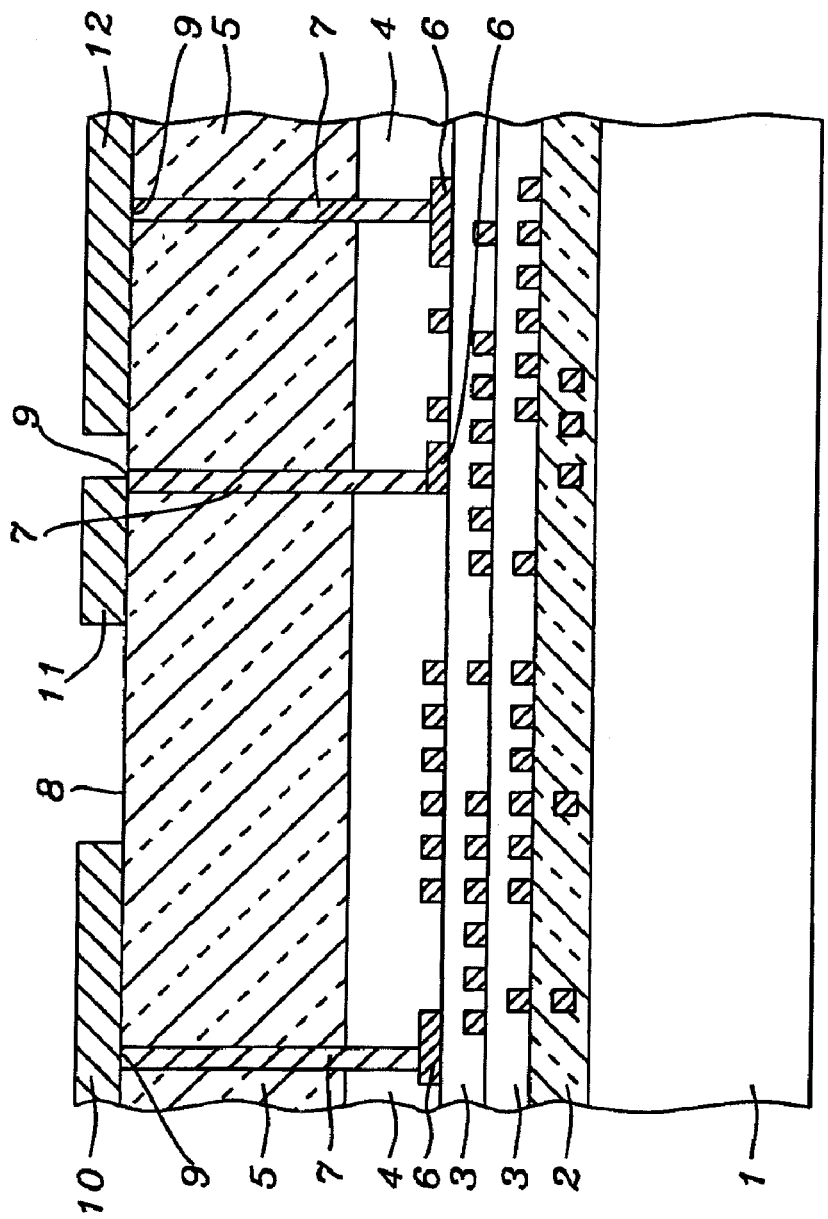

Referring now more specifically to FIG. 1b, there is shown a cross section of one implementation of the present invention. A silicon substrate 1 has transistors and other devices, typically formed of polysilicon, covered by a dielectric layer 2 deposited over the devices and the substrate. Layer 3 indicates the totality of metal layers and dielectric layers that are typically created on top of the device layer 2. Points of contact 6, such as bonding pads known in the semiconductor art, are in the top surface of layers 3 and are part of layer 3. These points of contact 6 are points within the IC arrangement that need to be further connected to surrounding circuitry, that is to power lines or to signal lines. A passivation layer 4, formed of for example silicon nitride, is deposited on top of layer 3, as is known in the art for protecting underlying layers from moisture, contamination, etc.

The key steps of the invention begin with the deposition of a thick layer 5 of a polymer. A pattern 7 is exposed and etched through the polymer layer 5 and the passivation layer 4 where the pattern 7 is the same as the pattern of the contact points 6. This opens the contact points 6 up to the surface 8 of the polymer layer 5.

Figure 12A:
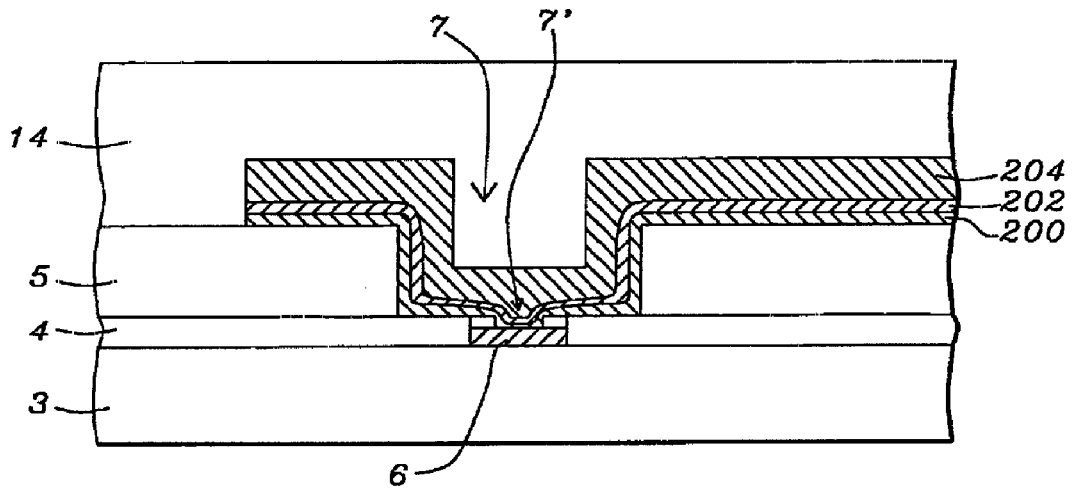
FIGS. 12a-12h shows a method for transitioning from a fine-line interconnection to the post passivation interconnection of the invention, and one method for forming the post passivation interconnection.

In one important aspect of the current invention, referring now to FIGS. 12a-12h, and specifically FIG. 12a, openings 7 in the polymer layer 5 may be larger than openings 7' in the passivation layer 4. Openings 7' may be formed to as small as 0.1 micrometers, and may range in size from between about 0.1 and 50 micrometers. These small passivation vias 7' are advantageous for the following reasons:

(1) small passivation vias only need small underlying metal pads (or dog bone structures); and these small metal pads will not block the routing capability of the top layer metal in the IC fine line interconnection scheme.

(2) Since the thickness of the inter-metal-dielectric (IMD) in the IC fine line interconnection is thin, a small metal pad is needed to provide small capacitance.

Figure 12B:
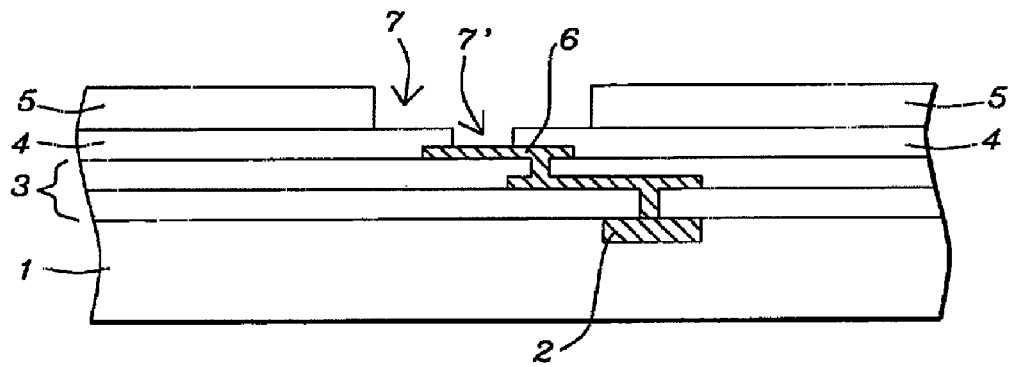
Figure 12C:
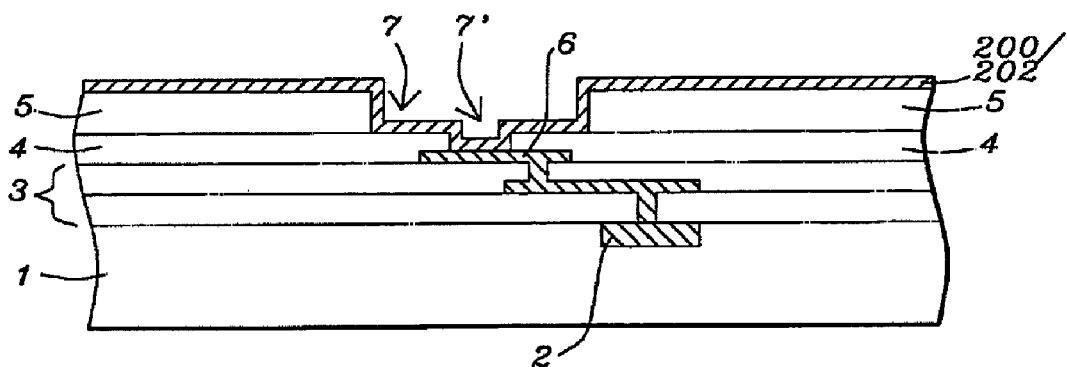
Figure 12D:
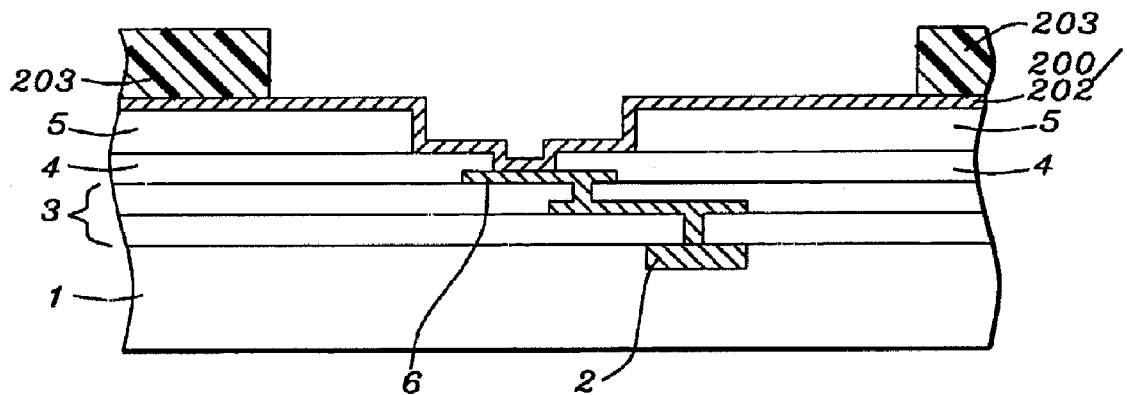
Figure 12E:
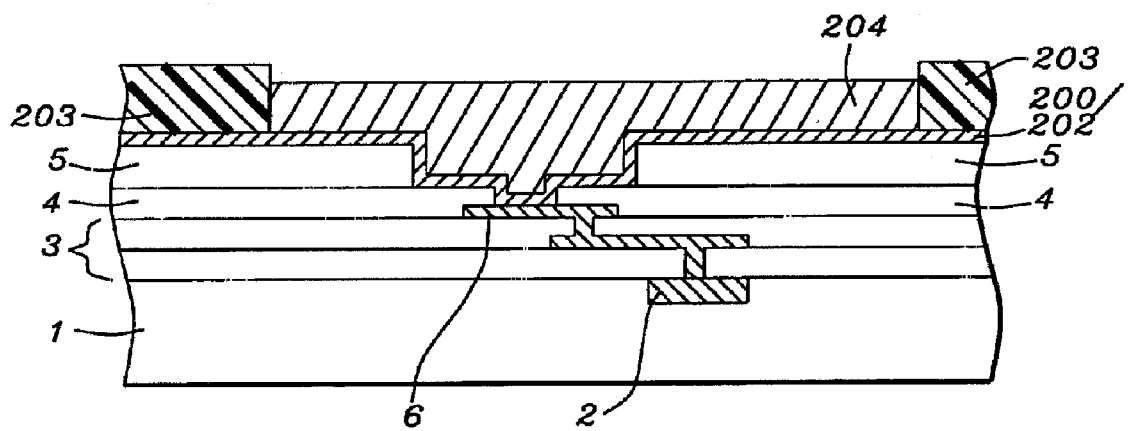
Figure 12F:
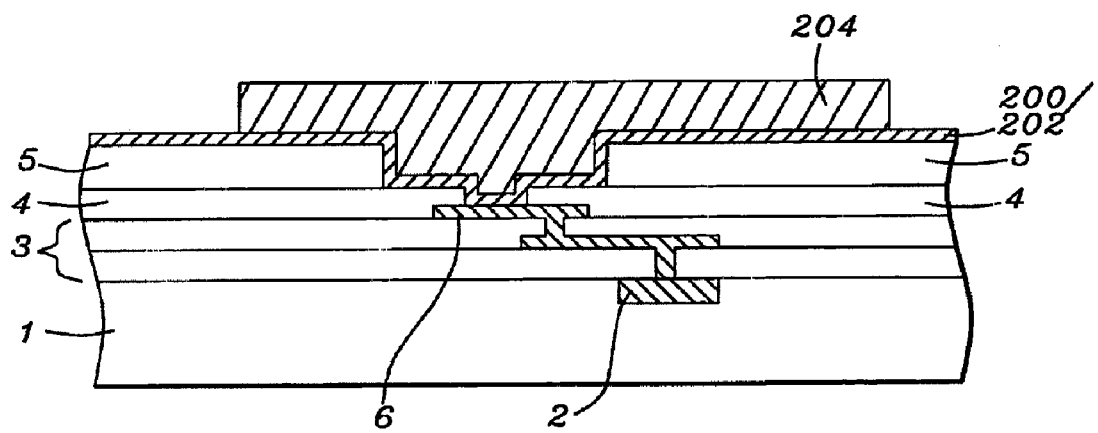
Figure 12G:
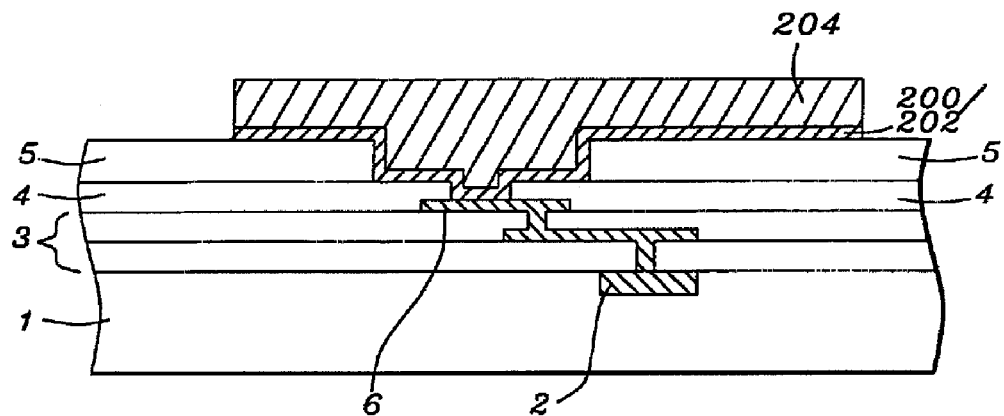
Figure 12H:
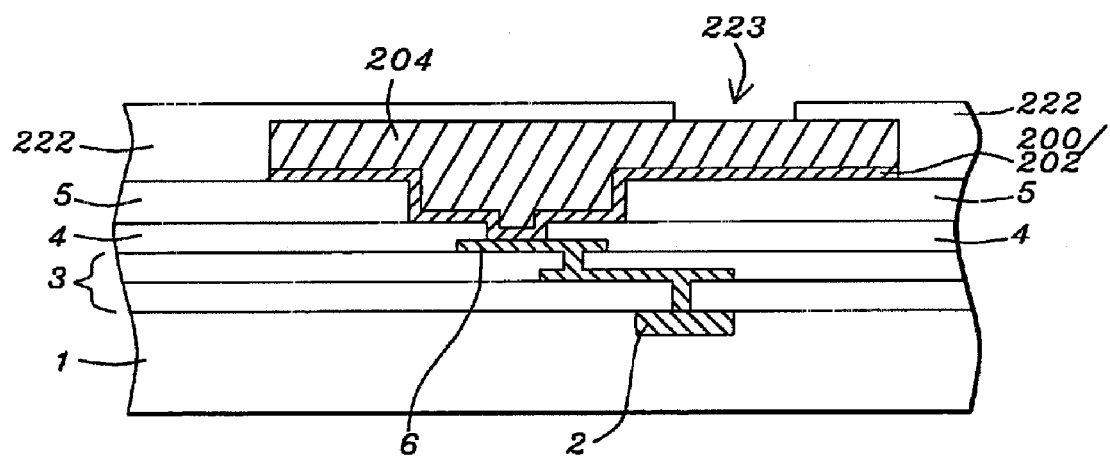
Figure 13:
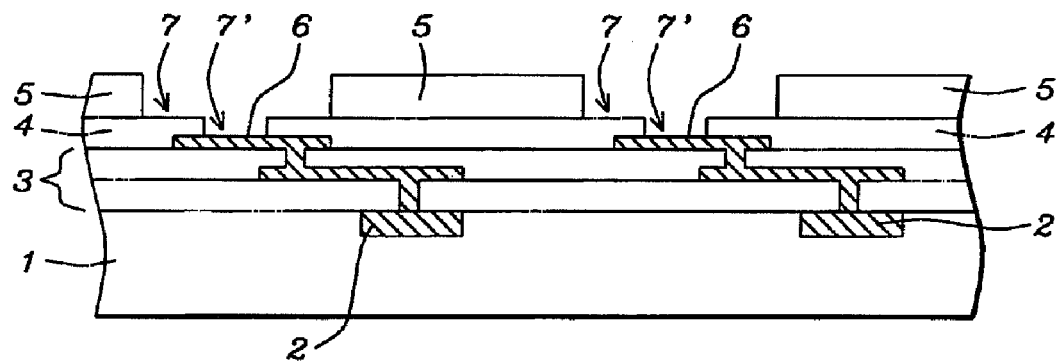
FIGS. 13-21 show a method for forming the thick, wide metal lines, and via fill, of the invention, using a dual damascene technique.

Electrical contact with the contact points 6 can now be established by filling the openings 7 (and 7') with a conductor. Simultaneously with filling of the openings 7, a first interconnect metal layer may be formed, as shown in FIG. 12a. This thick metal layer is formed by first sputtering an adhesion layer 200. The adhesion layer is formed of titanium tungsten (TiW), chromium (Cr), titanium (Ti), palladium (Pd), nickel (Ni) or titanium nitride (TiN), and is deposited to a thickness of between about 0.01 and 3 microns. An electroplating seed layer 202 is then deposited by sputtering, the seed layer material being copper (Cu), gold (Au), palladium (Pd) or nickel (Ni), formed to a thickness of between about 0.05 and 3 microns, as shown in FIGS. 12b and 12c. Pd is used as the seed layer when gold is to be electroplated, and Ni used as the seed layer for plating nickel. A thick photoresist 203, as depicted in FIG. 12d, of between about 2 and 100 microns thickness, is next deposited and patterned over the seed layer. A thick layer of metal, such as copper (Cu), gold (Au), palladium (Pd) or nickel (Ni), is then electroplated to a thickness of between about 2 and 100 microns, as shown in FIG. 12e, to form thick metal interconnections 204 and to fill openings 7. Referring now to FIG. 12f and 12g, the photoresist is then stripped, and portions of the seed metal and adhesion metal removed, using the thick metal as an etch mask.

Where Cu is used for electroplating to form the structure of FIG. 12g, a nickel cap layer (not shown) may be used to prevent copper corrosion and to prevent interaction of the copper with the surrounding polymer.

Subsequent metal layers may be formed in a similar manner to that shown for the first metal layer in FIGS. 12a-g. For example, referring to FIG. 12h, another thick polymer layer is deposited over the interconnect line 204 and an opening 223 formed for connection of the next metal layer to the first metal layer. Adhesion and electroplating seed layers are then sputtered, a thick photoresist deposited and the next thick metal layer electroplated, etc.

The thick metal 204 of the post passivation process of the invention is thicker then the typical fine-line metal layers 3 by a ratio of between about 2 and 1000 times. The thick metal layers are formed into interconnecting lines that also are wider than the fine-line metal by a ratio of between about 2 and 1000 times. Thicker, wider metal in the post-passivation process of the invention reduces the resistance of these interconnections.

Alternately, the opening 7 may be filled with a metal plug, formed of, for example, tungsten, and then thick metal formed to contact the via plug, using the above described electroplating process.

In one embodiment of the invention, polymer layer 5 may be omitted, with the thick metal layer formed directly on passivation layer 4 and connecting to the underlying metal pads.

In one variation of the above-described process for forming the thick metal layers, damascene processes may be used, as shown in FIGS. 13-27. Please refer first to FIGS. 13-21, in which a dual damascene technique for forming 2 vias, followed by a single damascene method for forming interconnecting lines, is shown. Openings 7 and 7' are formed as previously described, in polymer layer 5 and passivation layer 4, respectively. Opening 7, and subsequent openings in the polymer layers of the top metallization system, can be formed in one of two ways. In a first, preferred method, polymer 5 (and subsequent polymer layers) is formed of a photosensitive polymer material, such materials being known in the art. Such photosensitive polymers can be exposed and developed directly using photolithography. Alternatively, a non-photosensitive polymer is used, and patterned using photoresist and known photolithography techniques. The former method is preferred due to the savings in materials cost, from not having to use thick layers of photoresist, which is expensive.

Figure 14:
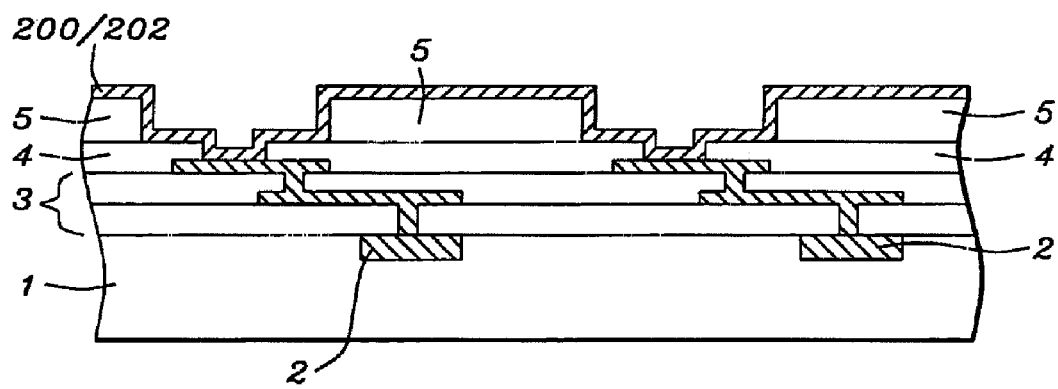
Figure 15:
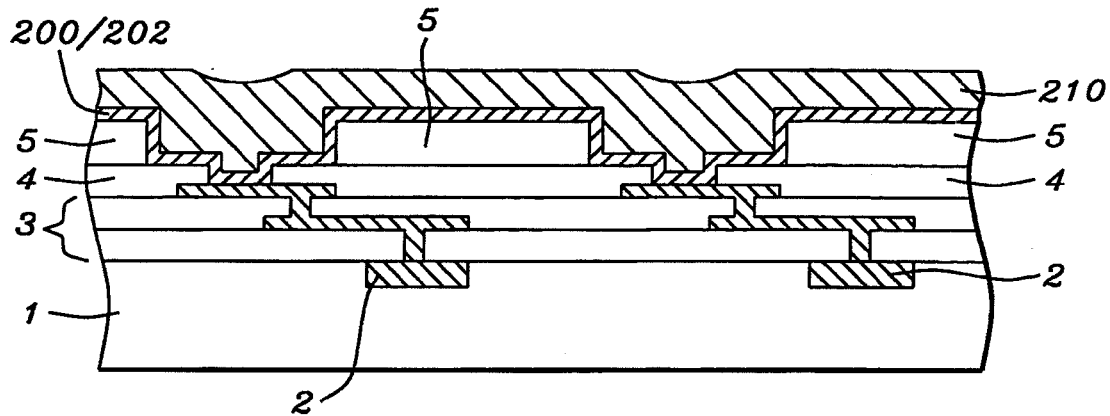
Figure 16:
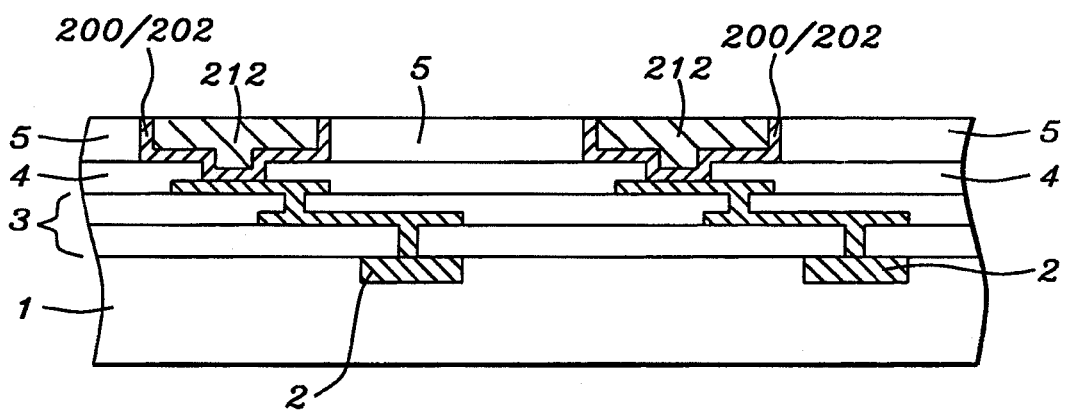
Figure 17:
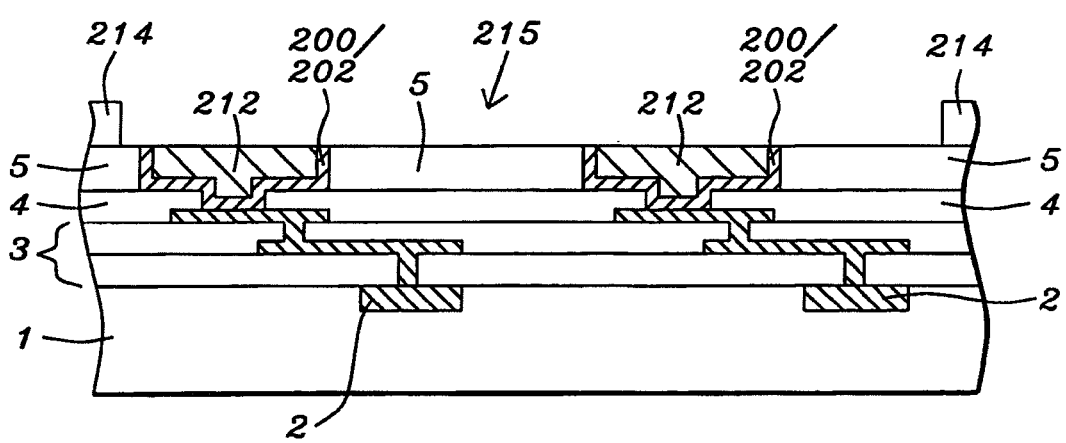

An adhesion layer 200 and an electroplating seed layer 202 are now formed, also as previously described with reference to FIG. 12a, and as shown in FIG. 14. Copper or gold 210 is electroplated up from seed layer 202 to fill openings 7' and 7, as well as above polymer layer 5, as depicted in FIG. 15. Chemical mechanical planarization (CMP) is used to remove the plated metal 210, seed layer 202, and adhesion layer 200, above polymer 5, stopping on polymer layer 5. This forms via plugs 212 above and connecting to contact points 6, as shown in FIG. 16. Via plugs 212 have a width of between about 1 and 300 micrometers.

Figure 18:
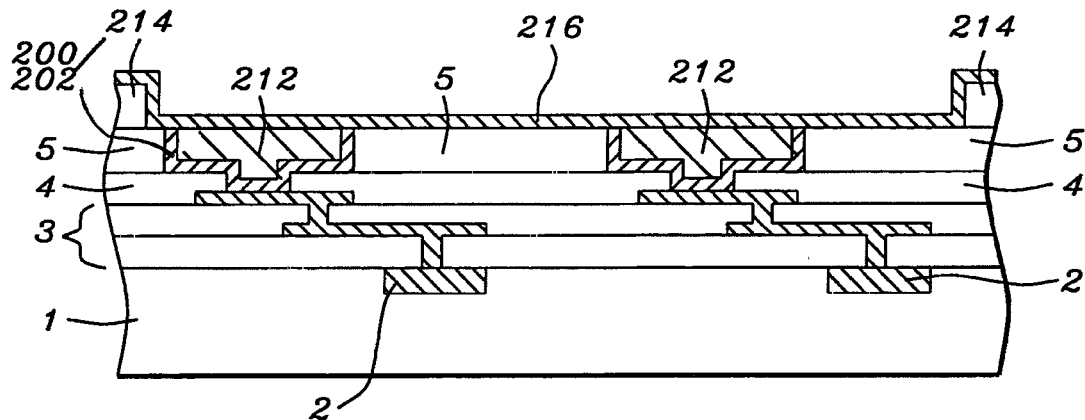
Figure 19:
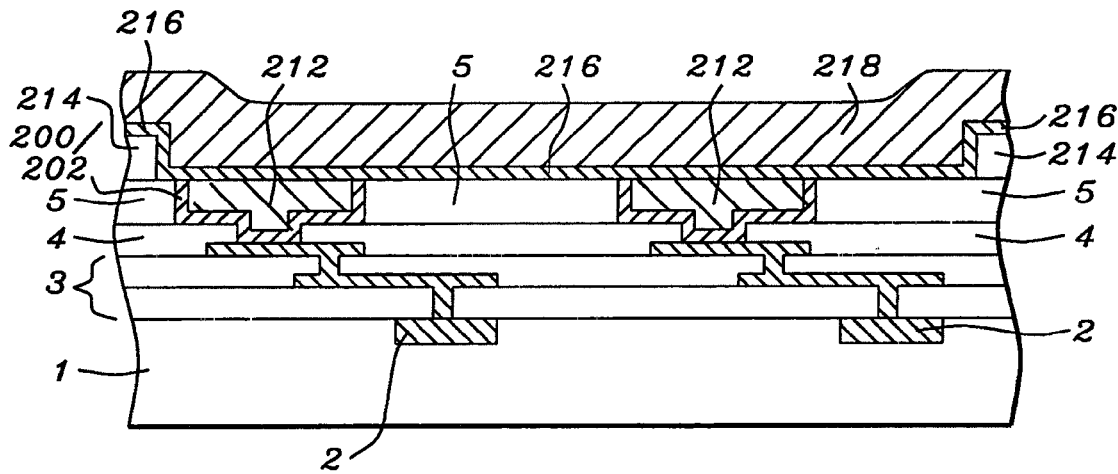
Figure 20:
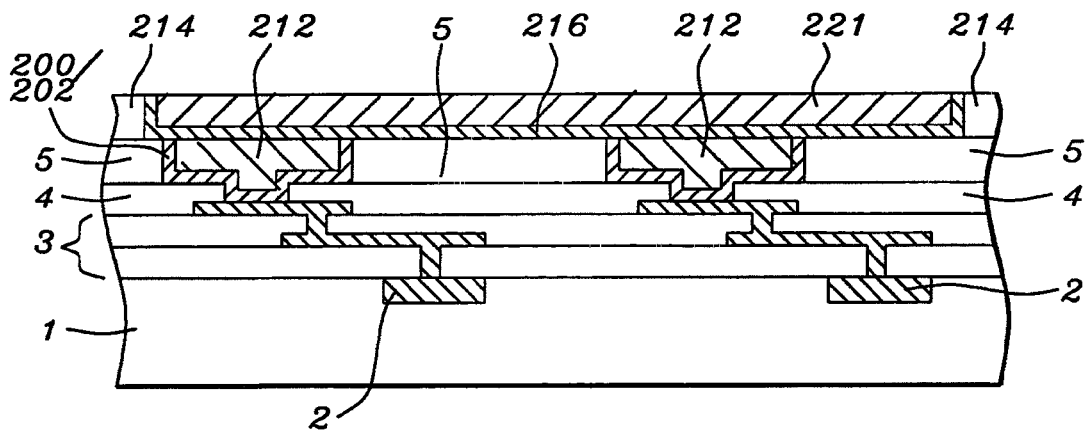

Referring now to FIGS. 17-21, polymer 214 is deposited and patterned to create interconnecting line opening 215, for the purposes of interconnecting two or more contact points 6 of the fine-line metallization system, using a single damascene method. In a similar manner as previously described, an adhesion layer and electroplating seed layer 216 are sputtered. Metal 218 is electroplated to fill line opening 215, and then planarized back, as shown in FIGS. 18-20. Thus thick interconnecting metal line 221 is formed, connecting two or more contact points 5, and having all the advantages of the invention herein described—thick, wide metal having low resistance and capacitance, and other advantages to be further described below.

Figure 21A:
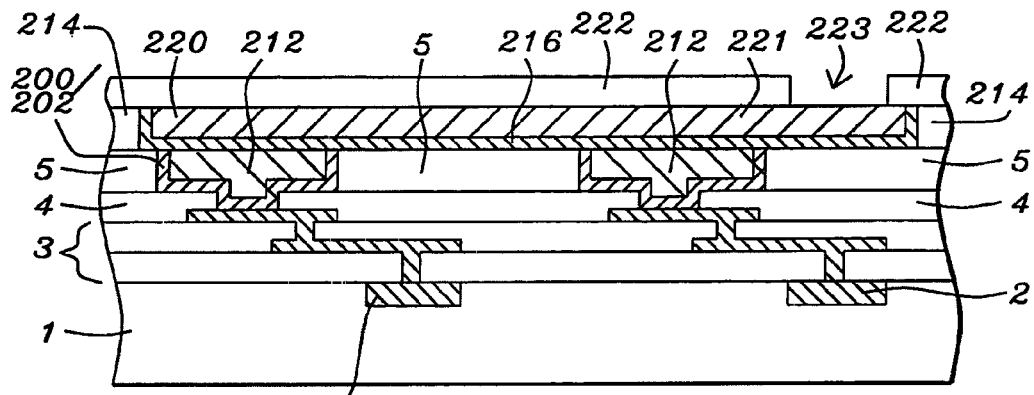
Figure 21B:
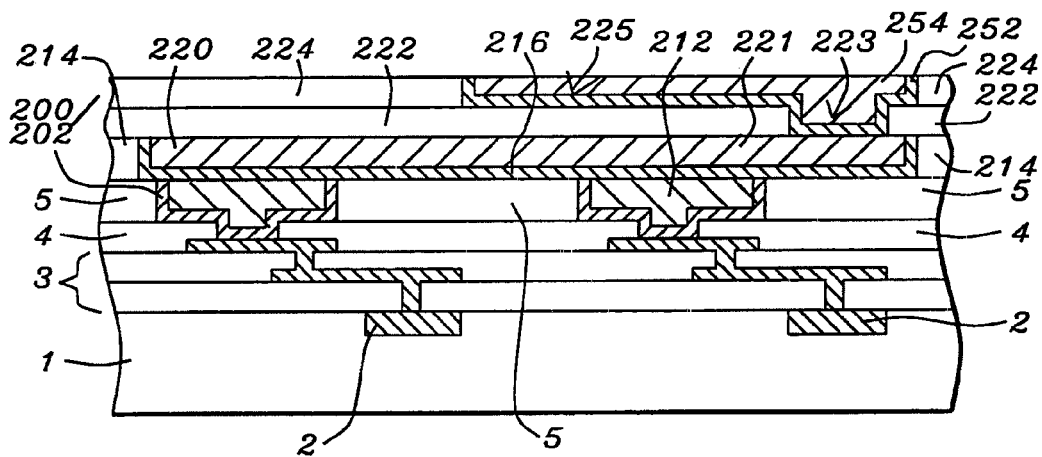
Figure 21C:
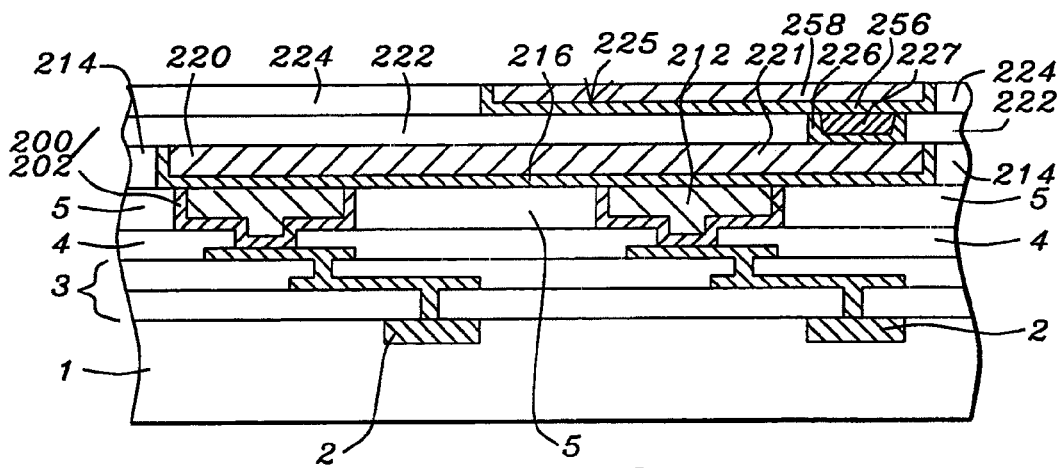
Figure 22:
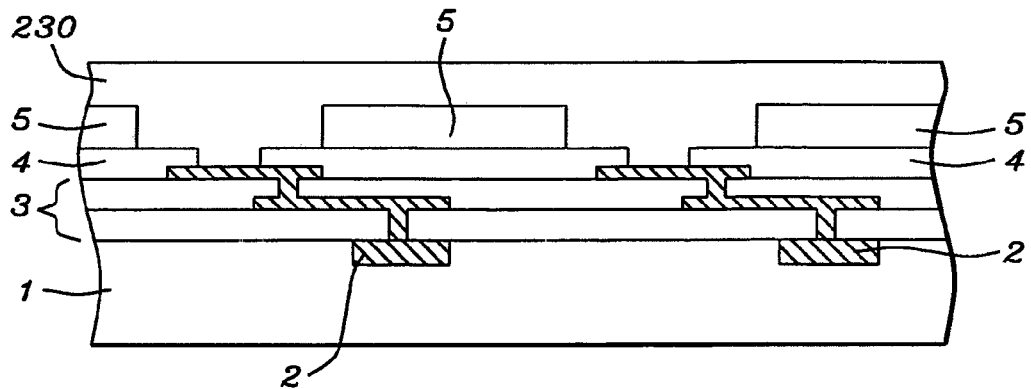
FIGS. 22-27 show a method for forming the thick, wide metal lines, and via fill, of the invention, using a triple damascene technique.

Further layers of the upper metal scheme may subsequently be formed. First, another polymer layer 222 is deposited and patterned to form via 223. Two alternatives may then be used to fill the via and form interconnecting lines. First, a dual damascene method is used, such as shown in FIG. 21b, in which a second polymer layer 224 is deposited and patterned to form interconnecting line opening 225. Subsequent processing then takes place, as described above, by forming adhesion layer 252, forming a seed layer, plating metal layer 254, and CMP to complete the interconnecting line. The second method is partially shown in FIG. 21c, in which via 223 is first filled with adhesion and seed layers 226, and then via metal 227 is electroplated and planarized using CMP. Then second polymer 224 is deposited, and patterned as shown, and then filled with adhesion layer 256 and metal 258 and planarized, to form interconnecting lines.

The above described damascene techniques provide excellent planarity, and particularly when photosensitive polymer is used, is very cost-effective.

Figure 23:
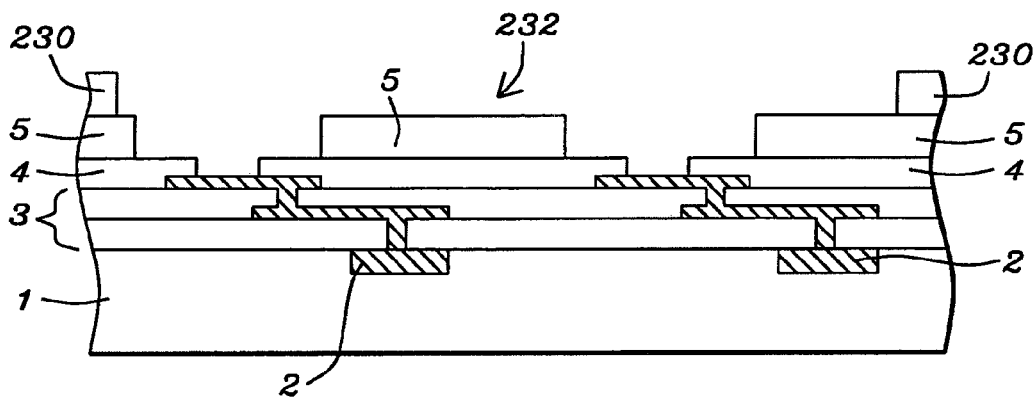
Figure 24:
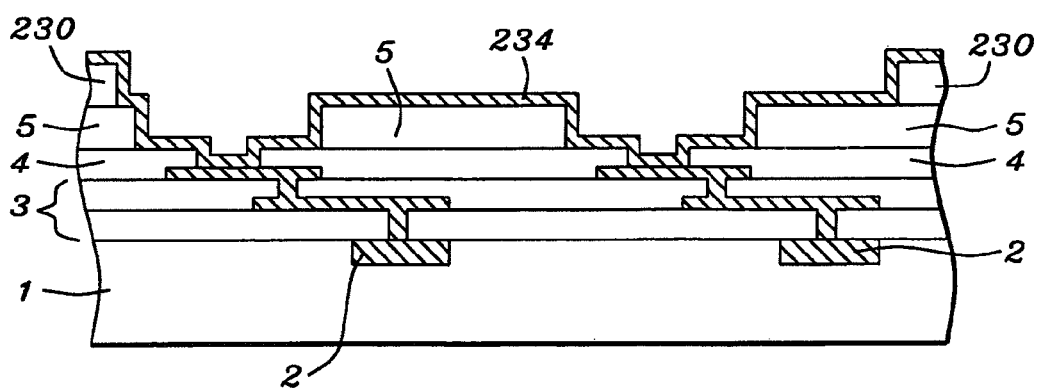
Figure 25:
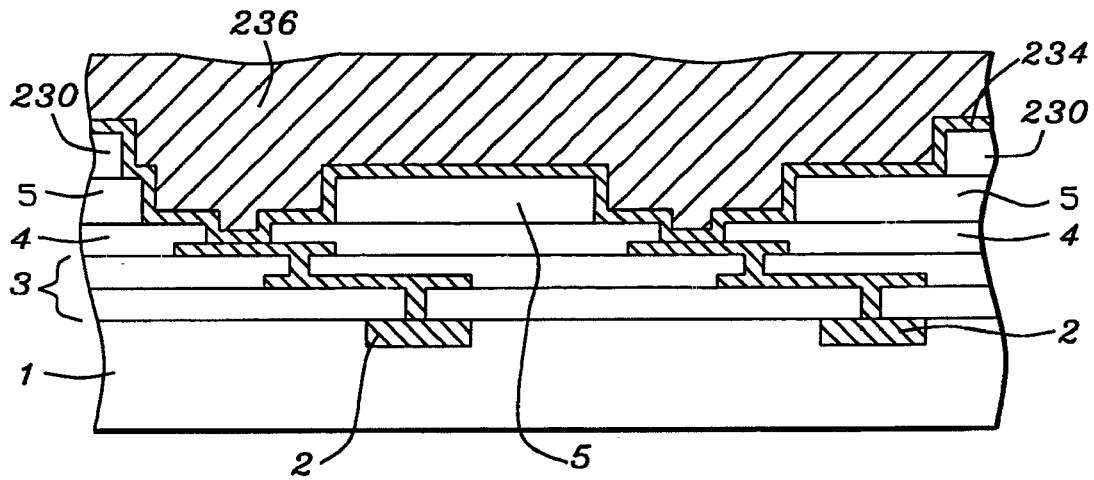
Figure 26:
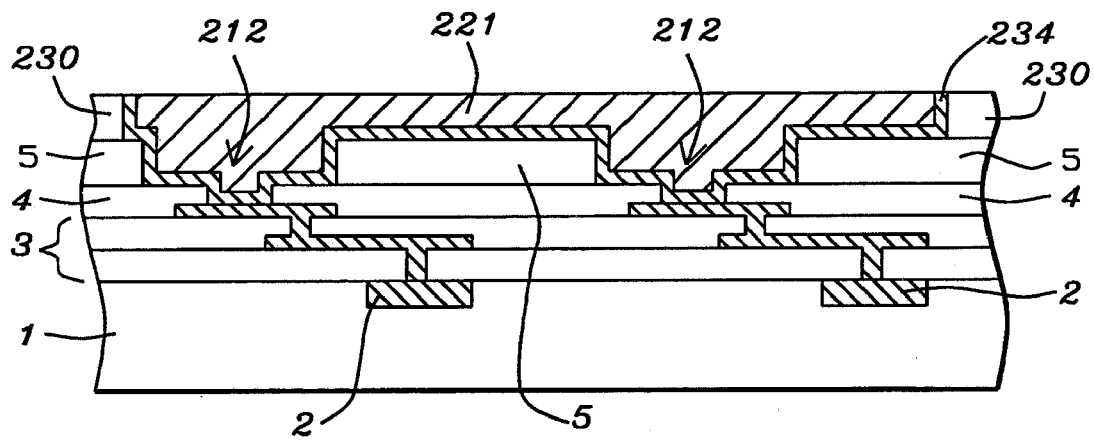
Figure 27:
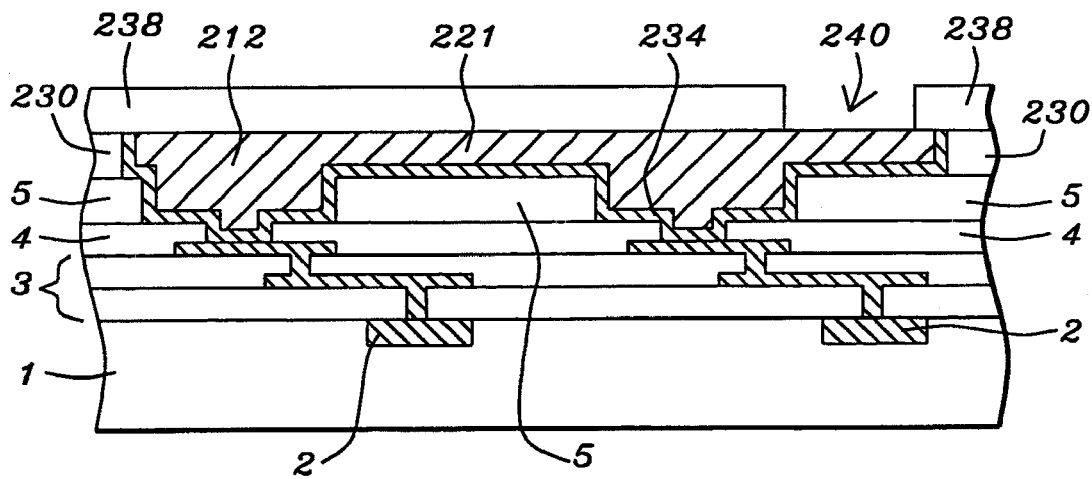

FIGS. 22-27 depict a triple damascene process for forming the first metal system above passivation 4. Starting from the configuration shown in FIG. 13, a photoresist or other photosensitive polymer 230 is deposited to fill openings 7 and 7', as well as above polymer 5. This layer is patterned using conventional lithography and etching to form opening 232, as shown in FIG. 23. Adhesion layer and electroplating seed layer (shown as a single layer 234) are sputtered as previously described, as depicted in FIG. 24, followed by gold or copper plating 236, in FIG. 25. CMP is used to planarize back the plated layer, and this simultaneously forms via plugs 212 and thick, wide interconnection 221. Subsequent additional layers of metal may then be formed, after deposition of polymer layer 238 and formation of opening 240, etc, shown in FIG. 27, by using the techniques described above with reference to FIGS. 21b-21c.

Figure 28:
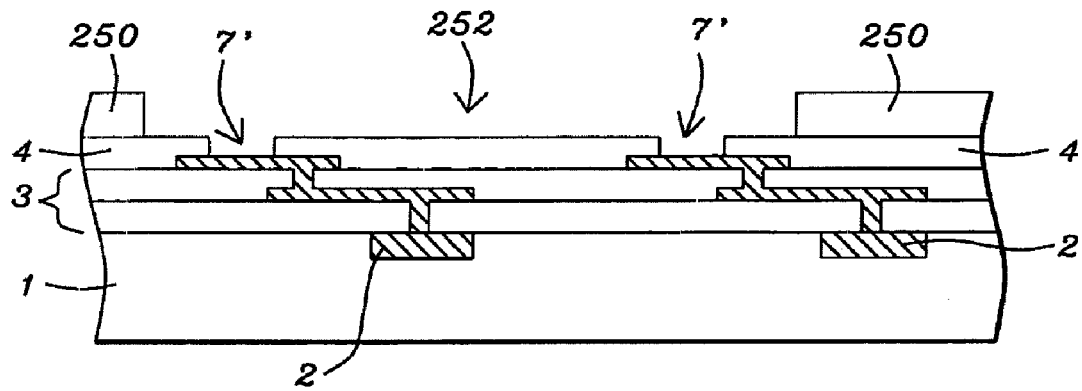
FIG. 28 shows an embodiment of the invention in which a first metal layer of the invention is deposited directly on the passivation layer.
Figure 29:
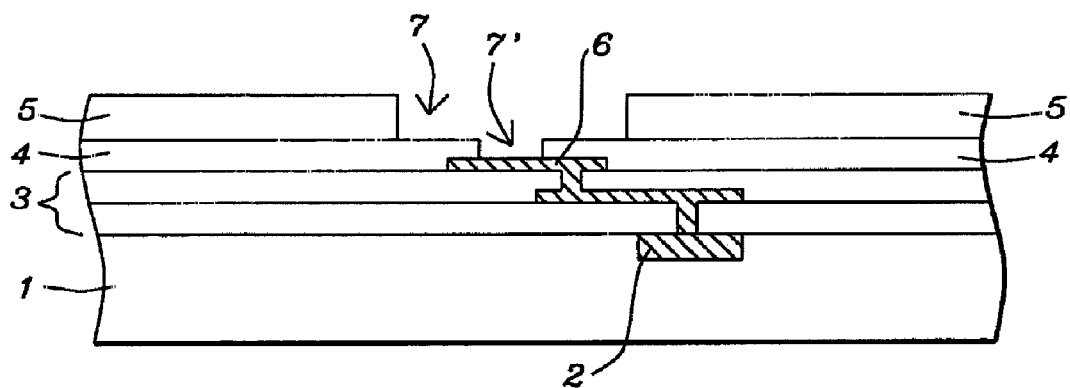
FIGS. 29-35 show another embodiment of the invention in which the top metal system of the invention is formed by deposition and etching.

In another embodiment of the invention, the first metal lines of the invention top metallization system may be formed directly on passivation layer 4, as partially shown in FIG. 28. A dual damascene technique may be used to fill via 7' and line opening 252, within polymer layer 250. Metallization is performed similarly to that discussed above and so will not be further described in detail.

Figure 30:
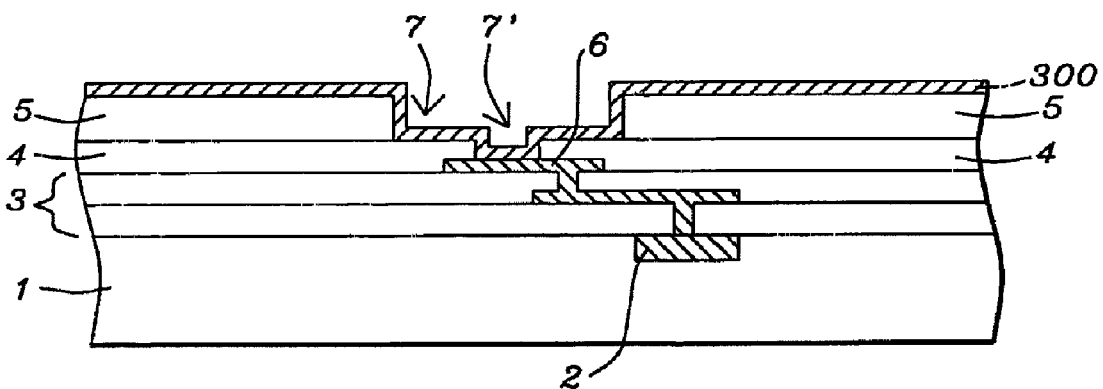
Figure 31:
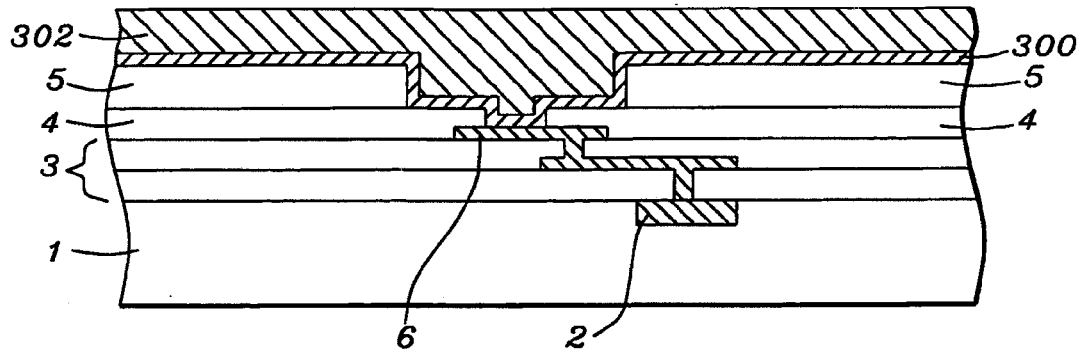

An alternative to using the above-described damascene techniques for metallization of the top metal system of the invention is to use a metal deposition and etch, as shown in FIGS. 29-35. In one embodiment, pure aluminum Al is blanket sputtered and patterned to form vias and interconnecting lines. Patterning can be by dry or wet etching. Copper Cu, nickel Ni, or gold Au may also be blanket sputtered instead of aluminum Al, using an underlayer of titanium (Ti), titanium tungsten (TiW) or chromium (Cr) (as an adhesion and barrier layer), and then patterned by wet etching. The detailed process is shown starting in FIG. 30, in which the adhesion layer 300 is sputtered into via 7 and 7', to contact the pad 6, and covers (optional) polymer layer 5. In FIG. 30, the bulk metal 302 (Au, Cu or Ni) is sputtered over the adhesion layer (or in the case of Al, blanket sputtering is used without the adhesion layer), to fill vias 7 and 7' and to a thickness sufficient to form metal interconnecting lines, between 2 and 100 microns.

Figure 32:
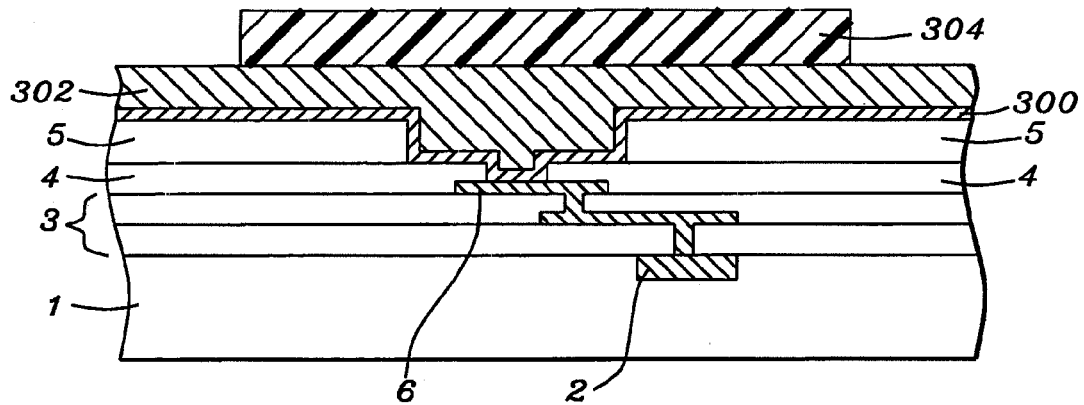
Figure 33:
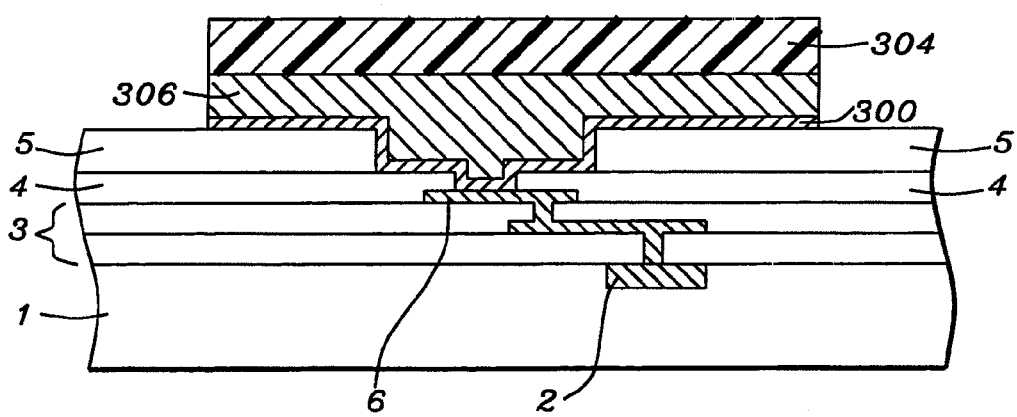
Figure 34:
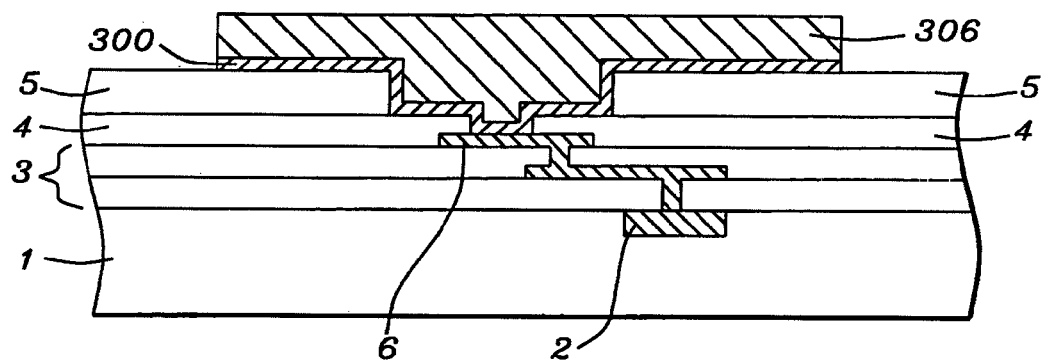
Figure 35:
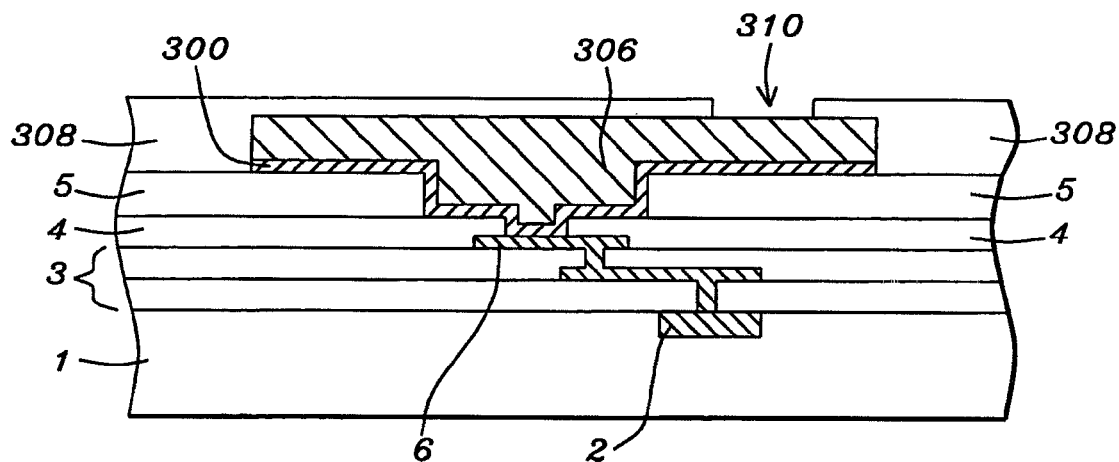

As shown in FIG. 32, photoresist 304 is next deposited and patterned to allow for etching of the metal interconnecting lines of the invention, 306, as shown in FIG. 33. Etching of the bulk metal 302 and underlying adhesion layer 300 can be performed by dry or wet etching. Referring to FIG. 34, the photoresist 304 is stripped. Subsequent metal layers may be formed in a similar manner to that shown for the first metal layer in FIGS. 30-34. For example, referring to FIG. 35, another thick polymer layer 308 is deposited over the interconnect line 306 and an opening 310 formed for connection of the next metal layer to the first metal layer. Adhesion and bulk metal layers are then sputtered as described above, a photoresist deposited and patterned, metal etching performed, etc.

Referring now back to FIG. 1, the tops 9 of the top metal conductor can now be used for connection of the IC to its environment, and for further integration into the surrounding electrical circuitry. Pads 10, 11 and 12 are formed on top of the top 9 of the metal conductors 7; these pads can be of any design in width and thickness to accommodate specific circuit design requirements. A larger size pad can, for instance, be used as a flip chip pad. A somewhat smaller in size pad can be used for power distribution or as a ground or signal bus. The following connections can, for instance, be made to the pads shown in FIG. 1: pad 10 can serve as a flip chip pad, pad 11 can serve as a flip chip pad or can be connected to electrical power or to electrical ground or to an electrical signal bus, pad 12 can also serve as a flip chip pad. There is no connection between the size of the pads shown in FIG. 1 and the suggested possible electrical connections for which this pad can be used. Pad size and the standard rules and restrictions of electrical circuit design determine the electrical connections to which a given pad lends itself.

The following comments relate to the size and the number of the contact points 6, FIG. 1. Because these contact points 6 are located on top of a thin dielectric (layer 3, FIG. 1) the pad size cannot be too large since a large pad size brings with it a large capacitance. In addition, a large pad size will interfere with the routing capability of that layer of metal. It is therefore preferred to keep the size of the pad 6 small. The size of pad 6 is however also directly related with the aspect ratio of via 7. An aspect ratio of about 5 is acceptable for the consideration of via etching and via filling. Based on these considerations, the size of the contact pad 6 can be in the order of 0.5 micrometers. to 3 micrometers. the exact size being dependent on the thickness of layers 4 and 5. The contact points 6 can comprise any appropriate contact material, such as but not limited to tungsten, copper (electroplated or electroless), chromium, aluminum, polysilicon, or the like.

The present invention does not impose a limitation on the number of contact pads that can be included in the design; this number is dependent on package design requirements. Layer 4 in FIG. 1 can be a typical IC passivation layer.

The most frequently used passivation layer in the present state of the art is plasma enhanced CVD (PECVD) oxide and nitride. In creating layer 4, a layer of approximately 0.2 micrometers. PECVD oxide is deposited first followed by a layer of approximately 0.7 micrometers. nitride. Passivation layer 4 is very important because it protects the device wafer from moisture and foreign ion contamination. The positioning of this layer between the sub-micron process (of the integrated circuit) and the tens-micron process (of the interconnecting metallization structure) is of critical importance since it allows for a cheaper process that possibly has less stringent clean room requirements for the process of creating the interconnecting metallization structure.

In addition to PECVD oxide and PECVD nitride, passivation layer 4 may also be formed of silicon oxynitride, phosphosilicate glass (PSG), borosilicate glass (BSG), borophosphosilicate glass (BPSG), or combinations thereof.

Layer 5 is a thick polymer dielectric layer (for example polyimide) that has a thickness in excess of 2 micrometers (after curing). The range of polyimide thickness can vary from 2 micrometers. to 50 micrometers. dependent on electrical design requirements. The polymer layer 5 is thicker than the intermetal dielectric layers in the interconnecting, fine-line, metallization structure by 2 to 500 times.

For the deposition of layer 5 the Hitachi-Dupont polyimide HD 2732 or 2734 can, for example, be used. The polyimide can be spin-on coated and cured. After spin-on coating, the polyimide will be cured at 400 degrees C. for 1 hour in a vacuum or nitrogen ambient. For thicker polyimide, the polyimide film can be multiple coated and cured.

Another material that can be used to create layer 5 is the polymer benzocyclobutene (BCB). This polymer is at this time commercially produced by for instance Dow Chemical and has recently gained acceptance to be used instead of typical polyimide application. Yet other possible materials for layer 5 include a silicone elastomer, paralyne, or parylene.

The dimensions of opening 7 have previously been discussed. The dimension of the opening together with the dielectric thickness determines the aspect ratio of the opening. The aspect ratio challenges the via etch process and the metal filling capability. This leads to a diameter for opening 7 in the range of approximately 0.5 micrometers. to 3.0 micrometers. while the height for opening 7 can be in the range of approximately 3 micrometers. to 20 micrometers. The aspect ratio of opening 7 is designed such that filling of the via with metal can be accomplished. The via can be filled with CVD metal such as CVD tungsten or CVD copper, with electro-less nickel, with a damascene metal filling process, with electroplating copper, etc.

It must be noted that the use of polyimide films as interlevel dielectrics has been pursued as a technique for providing partial planarization of a dielectric surface. Polyimides offer the following characteristics for such applications:

they produce surfaces in which the step heights of underlying features are reduced, and step slopes are gentle and smooth.

they are available to fill small openings without producing the voids that occur when low-temperature CVD oxide films are deposited.

the cured polyimide films can tolerate temperatures of up to 500 degrees C. without degradation of their dielectric film characteristics.

polyimide films have dielectric breakdowns, which are only slightly lower than that of $SiO_2$.

the dielectric constant of polyimides is smaller than that of silicon nitride and of $SiO_2$.

the process used to deposit and pattern polyimide films is relatively simple.

For all of the above characteristics, polyimides are used and recommended within the scope of the present invention.

Figure 2:
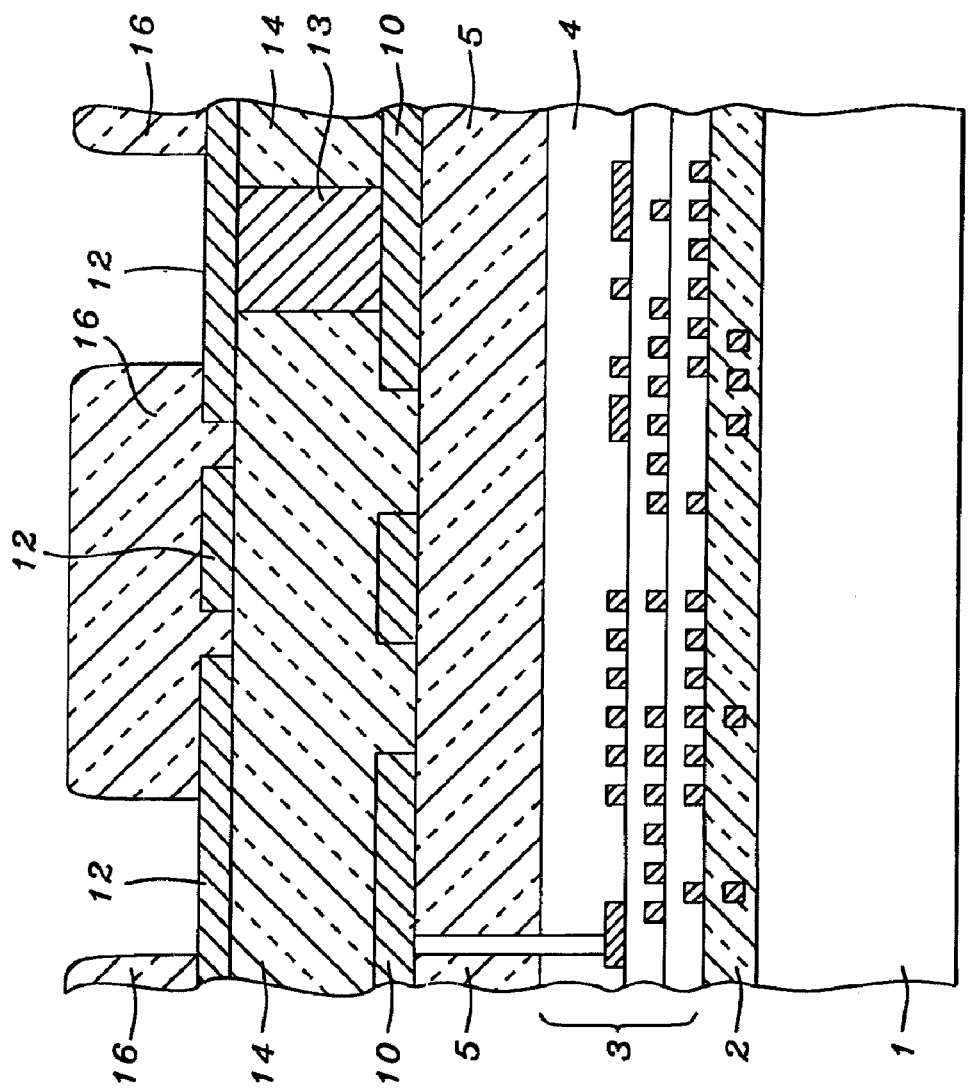
FIG. 2 shows a cross section of the present invention in a more complex circuit configuration.

FIG. 2 shows how the present invention as indicated in FIG. 1 can be further extended to include multiple layers of polyimide and, in so doing, can be adapted to a larger variety of applications. The lower level build up of this cross section is identical to the build up shown in FIG. 1 with a silicon wafer 1, the poly silicon layer 2, the metal and dielectric combined layer 3, the passivation layer 4, the polyimide layer 5 and the pads 10 deposited on top of layer 5. The function of the structure that has been described in FIG. 1 can be further extended by depositing another layer of polyimide 14 on top of the previously deposited layer 5 and overlaying the pads 10. Selective etching and metal deposition can further create contact points 12. These contact points 12 can be connected with pads 10 as shown by connector 13. Depositing pads 12 on top of layer 14 can thus further extend this process. These pads 12 can be further customized to a particular application, the indicated extension of multiple layers of polyimides greatly enhances the flexibility and usefulness of the present invention. Additional alternating layers of polyimide and metal lines and/or power or ground planes may be added above layers 12 and 16, as needed. Contact between metal layers formed in the post passivation method of the invention can be made by direct contact between two layers of metal (as shown in FIG. 12), or alternately by metal plugs formed in the openings between metal layers.

The polymer layers 14 that are formed between the thick, post-passivation metal lines are formed to a thickness of between about 2 and 30 microns, after curing, and are thicker than the intermetal dielectric layers formed in the typical fine-line metal scheme (layers 3) by a ratio of between about 2 and 500. The thicker, organic polymer used in the post-passivation process of the invention reduces capacitance between the thick metal lines. The inorganic materials, such as silicon oxide, used in the fine-line metallization system 3, cannot be formed to such thicknesses due to a tendency to crack at these thicknesses.

Figure 3A:
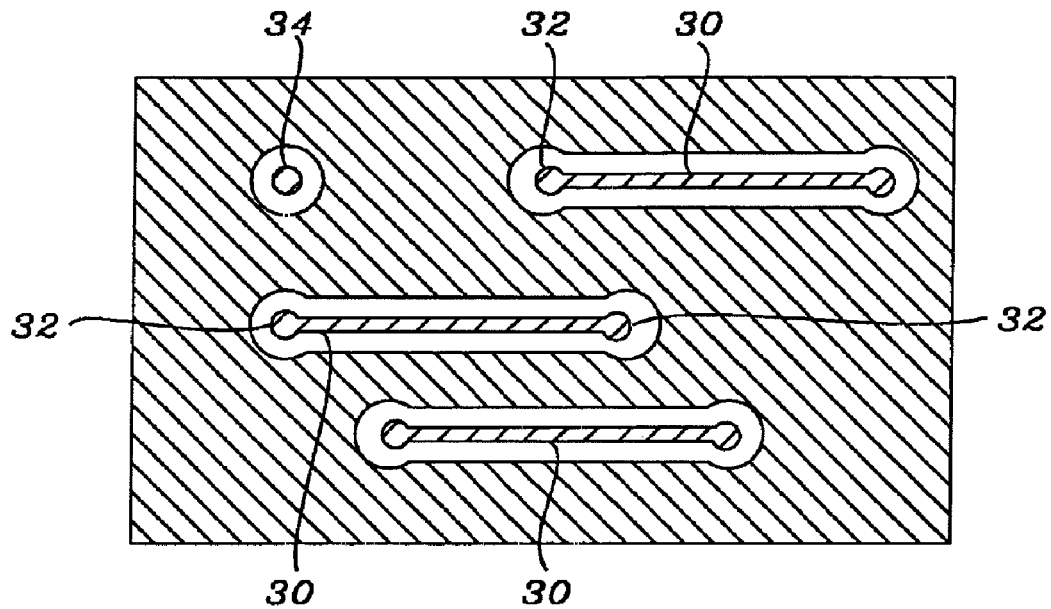
FIG. 3a shows the top view of a combination power and X-signal plane using the present invention.
Figure 3B:
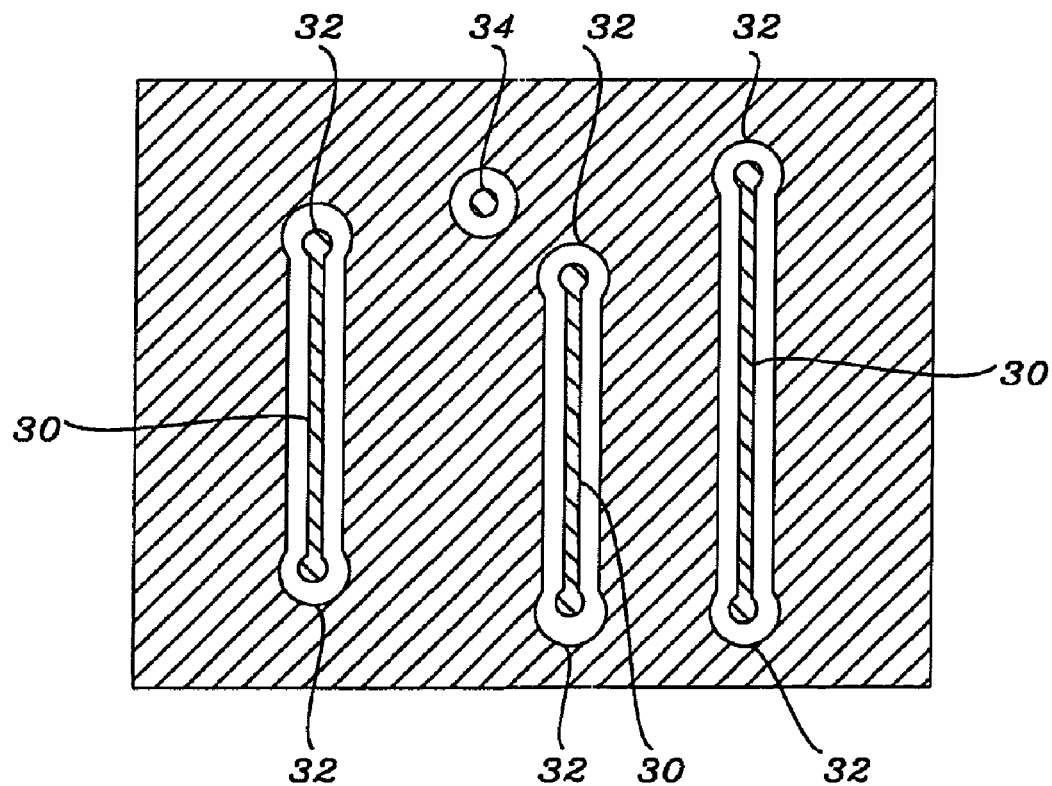
FIG. 3b shows the top view of a combination power and Y-signal plane using the present invention.

FIGS. 3a and 3b show a top view of one possible use of the present invention. Interconnecting a number of pads 32 that have been created as described creates signal lines 30. Additional contact points such as point 34 can allow signal lines to pass vertically between layers. The various contact points can, for instance, be created within the surface of a power plane or ground plane 36. The layers within the interconnecting metallization structure of the present invention can contain signal interconnections in the X-direction, signal interconnections in the Y-direction, signal interconnections between X and or Y directions, interconnections to and/or within power and/or ground buses. The present invention further teaches the interconnection of signal lines, power and ground buses between the connected IC's and the top of the metallization system of the present invention.

FIG. 3a shows signal lines formed in the X-direction, FIG. 3b shows signal lines formed in the Y-direction.

Figure 4:
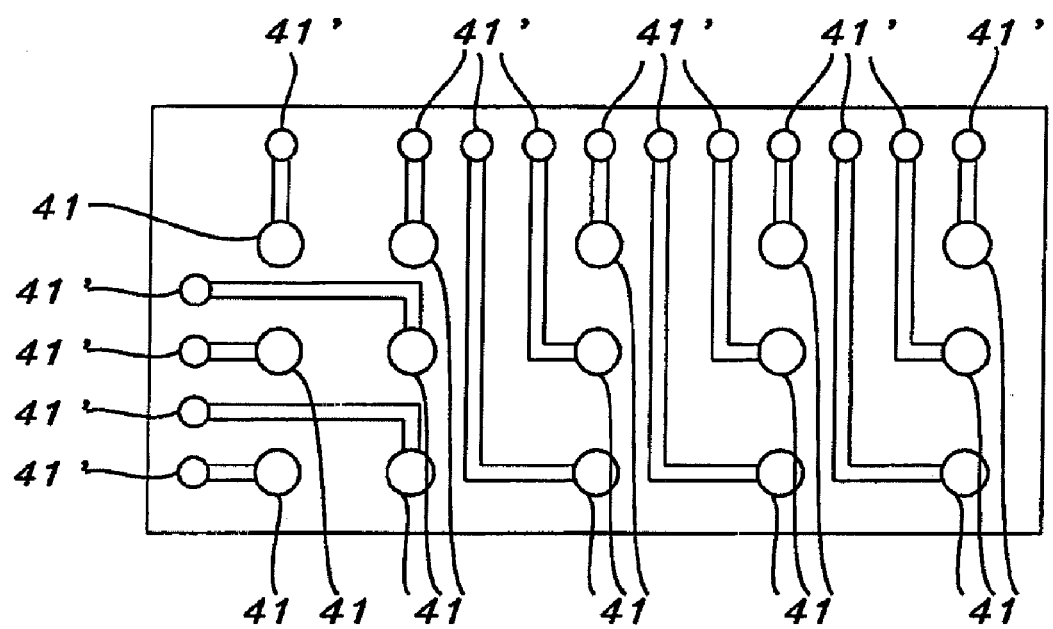
FIG. 4 shows the top view of solder bump arrangement using the present invention and is an expanded view of a portion of FIG. 5.

FIG. 4 presents yet another application of the present invention. Shown in FIG. 4 is an exploded view of a part of FIG. 5 that presents an area array I/O distribution. FIG. 4 shows pads 41 (on which solder bumps can be created) and an example of a layout of the redistribution of the peripheral pads 41'. The exploded view of FIG. 4 is taken along the line 2-2' shown in FIG. 5, the redistribution of the peripheral pads 41' (see FIG. 4) is, for clarity of overview, not shown in FIG. 5. The power or ground connections can be made to any point that is required on the bottom device. Furthermore, the power and ground planes can be connected to the power and ground planes of the package substrates. FIG. 4 shows an example of how to use the topmost metal layer to redistribute the peripheral pads 41' to become area array pads 41. The solder bumps can then be created on pads 41.

Figure 5:
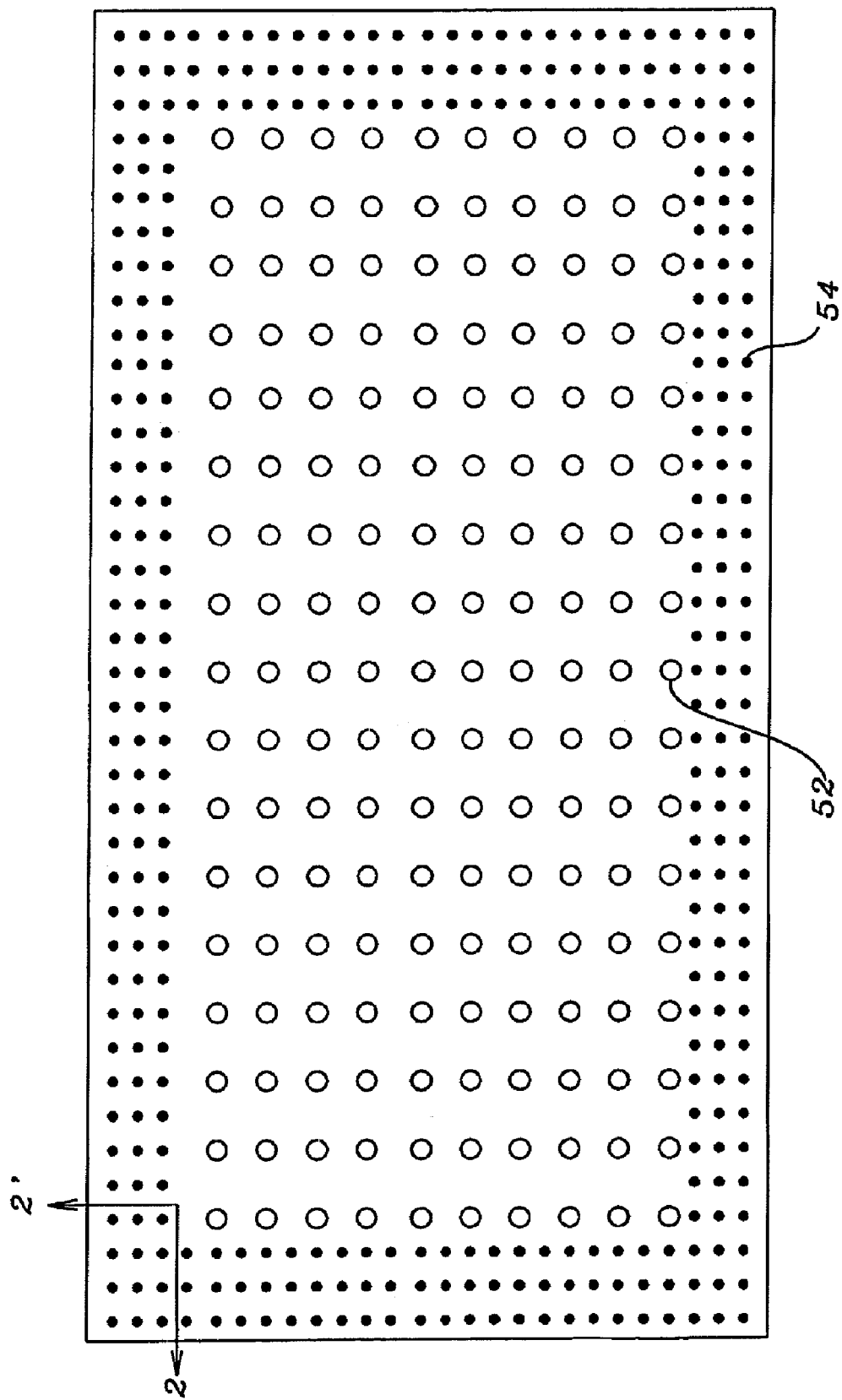
FIG. 5 shows the top view of an example of power/ground pads combined with signal pad using the present invention.

FIG. 5 shows the top surface of a plane that contains a design pattern of a combination of power or ground pads 52 and signal pads 54. FIG. 5 shows the pad openings in the top dielectric layer. It is to be noted that the ground/power pads 52 are heavier and larger in design relative to the signal pads 54. The present invention ideally lends itself to meeting these differences in design, as they are required within the art of chip and high performance circuit design. The number of power or ground pads 52 shown in FIG. 5 can be reduced is there are power and/or ground planes within the chip. From this it is clear that the package number of I/O's can be reduced within the scope of the present invention which leads to a reduction of the package cost by eliminating common signal/power/ground connections within the package. For instance, a 470 I/O count on a BGA chip can, within the scope of the present invention, be reduced to a 256 I/O count using the present invention. This results in considerable savings for the overall package.

Figure 6:
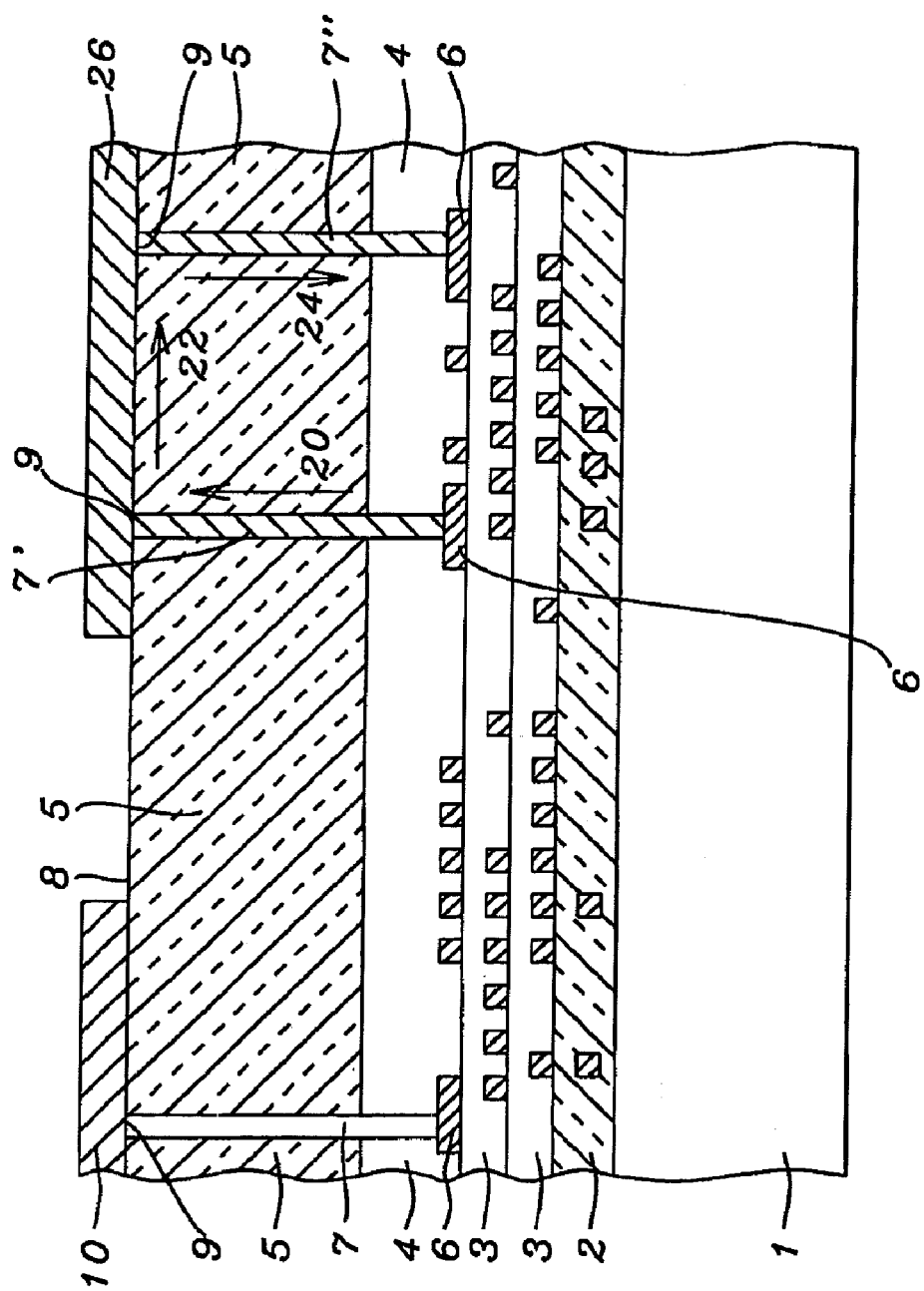
FIG. 6 shows a basic integrated circuit (IC) interconnect scheme of the invention.

FIG. 6 shows a basic design advantage of the invention. This advantage allows for the sub-micron or fine-lines, that run in the immediate vicinity of the metal layers 3 and the contact points 6, to be extended in an upward direction 20 through metal interconnect 7'. This extension continues in the direction 22 in the horizontal plane of the metal interconnect 26 and comes back down in the downward direction 24 through metal interconnect 7". The functions and constructs of the passivation layer 4 and the insulating layer 5 remain as previously highlighted under FIG. 1. This basic design advantage of the invention is to "elevate" or "fan-out" the fine-line interconnects and to remove these interconnects from the micron and sub-micron level to a metal interconnect level that has considerably larger dimensions and is therefore characterized by smaller resistance and capacitance and is easier and more cost effective to manufacture. This aspect of the invention does not include any aspect of conducting line re-distribution and therefore has an inherent quality of simplicity. It therefore further adds to the importance of the invention in that it makes micron and sub-micron wiring accessible at a wide-metal level. The interconnections 7' and 7" interconnect the fine-level metal by going up through the passivation and polymer or polyimide dielectric layers, traverses over a distance on the wide-metal level and continues by descending from the wide-metal level back down to the fine-metal level by again traversing down through the passivation and polymer or polyimide dielectric layers. The extensions that are in this manner accomplished need not to be limited to extending fine-metal interconnect points 6 of any particular type, such as signal or power or ground, with wide metal line 26. The laws of physics and electronics will impose limitations, if any, as to what type of interconnect can by established in this manner where limiting factors will be the conventional limiting factors of resistance, propagation delay, RC constants and others. Where the invention is of importance is that the invention provides much broader latitude in being able to apply these laws and, in so doing, provides a considerably extended scope of the application and use of Integrated Circuits and the adaptation of these circuits to a wide-metal environment.

Figure 7:
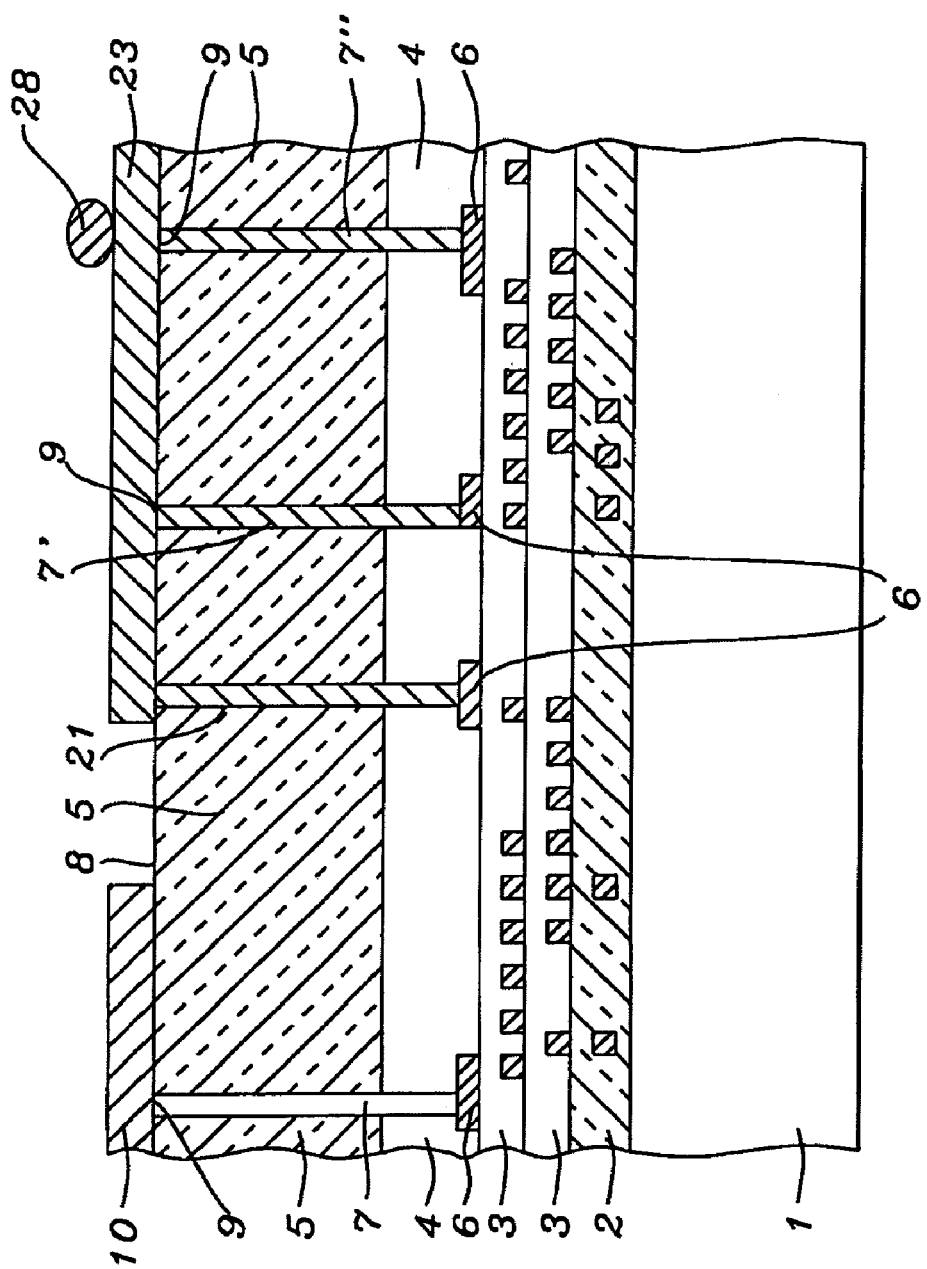
FIG. 7 shows an extension of the basic IC interconnect scheme by adding power, ground and signal distribution capabilities.

FIG. 7 shows how the basic interconnect aspect of the invention can further be extended to now not only elevate the fine-metal to the plane of the wide-metal but to also add power, ground and signal distribution interconnects of power, ground and signal planes at the wide-metal level. The wide-metal interconnect 26 of FIG. 6 is now extended to further include an interconnection with the via 21. In typical IC design, some pads may not be positioned in a location from which easy fan-out can be accomplished to a location that is required for the next step of circuit assembly. In those cases, the BGA substrate requires additional layers in the package construction in order to accomplish the required fan-out. The invention teaches an approach that makes additional layers in the assembling of an IC feasible while not unduly increasing the cost of creating such a multi-layer interface. Ball formation 28 on the surface of interconnect 23 indicates how the invention replaces part of the conventional BGA interconnect function, the solder bump provides for flip chip assembly. This interconnect 28 now connects the BGA device with surrounding circuitry at the wide-metal level as opposed to previous interconnects of the BGA device at the fine-metal level. The wide-metal interconnect of the BGA has obvious advantages of cost of manufacturing and improved BGA device performance. By being able to readily extend the wide-metal dimensions it also becomes possible to interconnect power, ground and signal lines at a wide-metal level thereby reducing the cost and complexity of performing this function at the fine-metal level. The indication of 28 as a ball does not imply that the invention is limited to solder bumps for making interconnects. The invention is equally applicable to wirebonding for making circuit interconnects.

Figure 8:
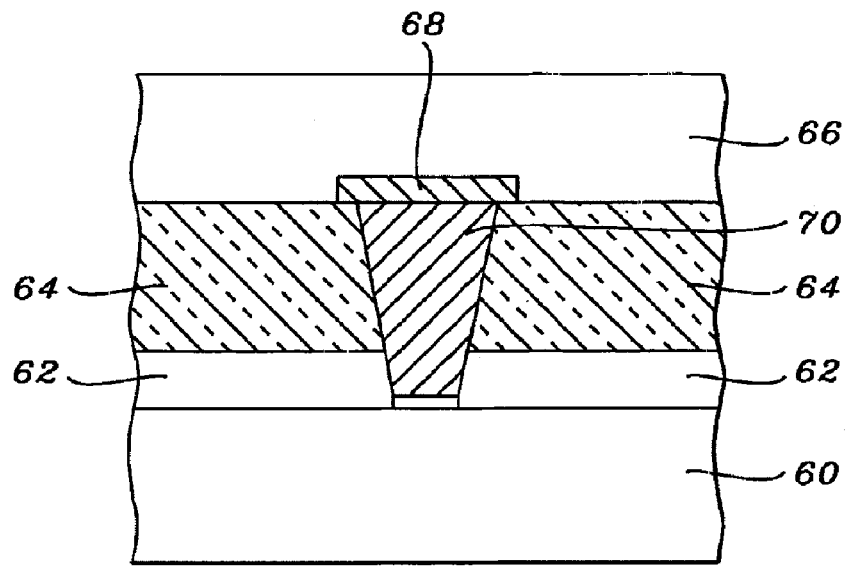
FIG. 8 shows an approach of how to transition from submicron metal to wide metal interconnects.

FIG. 8 further shows a cross section wherein the previous linear construction of the metal interconnection running through the passivation layer and the insulation layer is now conical in form. The sub-micron metal layer 60 is covered with a passivation layer 62, a layer 64 of polyimide or polymer is deposited over the passivation layer 62. The wide metal level 66 is formed on the surface of layer 64. The via 70 is shown as having sloping sides, these sloping sides can be achieved by controlling the photolithography process that is used to created the via 70. The etching of the polyimide or polymer can for instance be done under an angle of about 75 degrees with the following curing being done under an angle of 45 degrees. Also, a photosensitive polyimide or polymer can be used, the cone shape of the via 70 can in that case be achieved by variation of exposure combined with time of exposure combined with angle of exposure. Where non-photosensitive polymer or polyimide is used, a wet etch can be applied that has a gradated faster and longer time etch as the top of the via 70 is being approached. The layer of wide-metal pad 68 is deposited on the surface of the polymer or polyimide layer 64, the wide-metal pad deposition 68 mates with the top surface of the via 70 and is centered on top of this surface.

Figure 9:
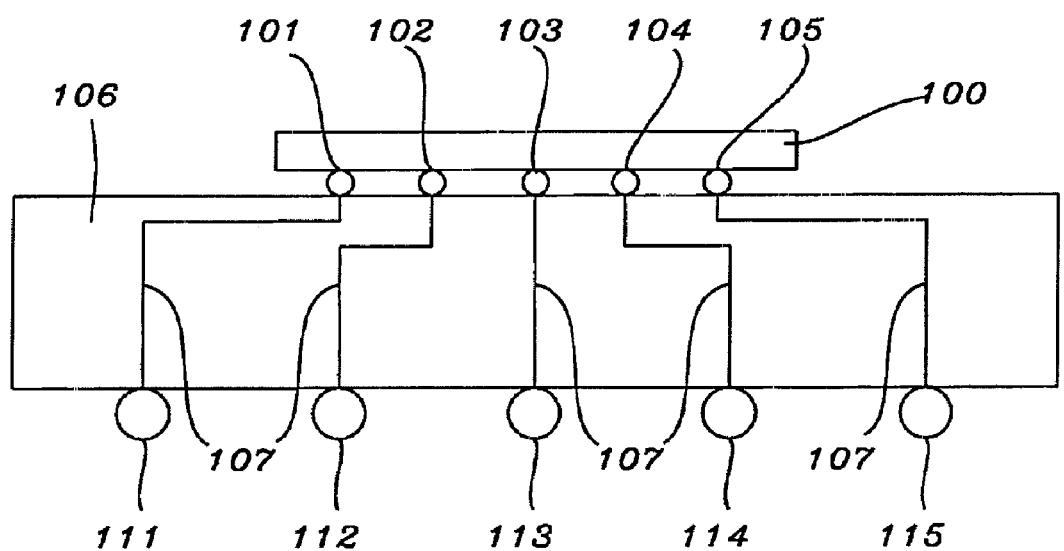
FIG. 9 shows detail regarding BGA device fan out using the invention.
Figure 10:
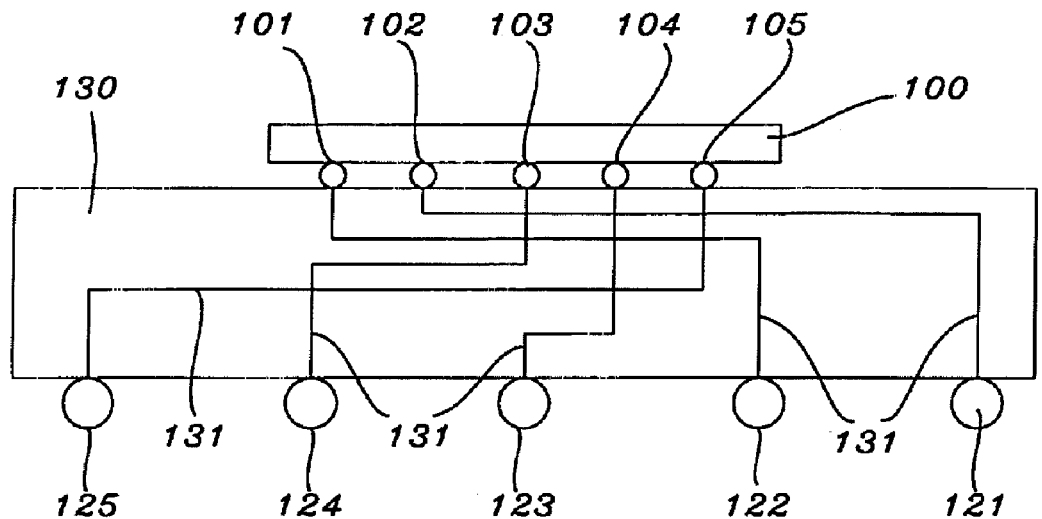
FIG. 10 shows detail regarding BGA device pad relocation using the invention.
Figure 11:
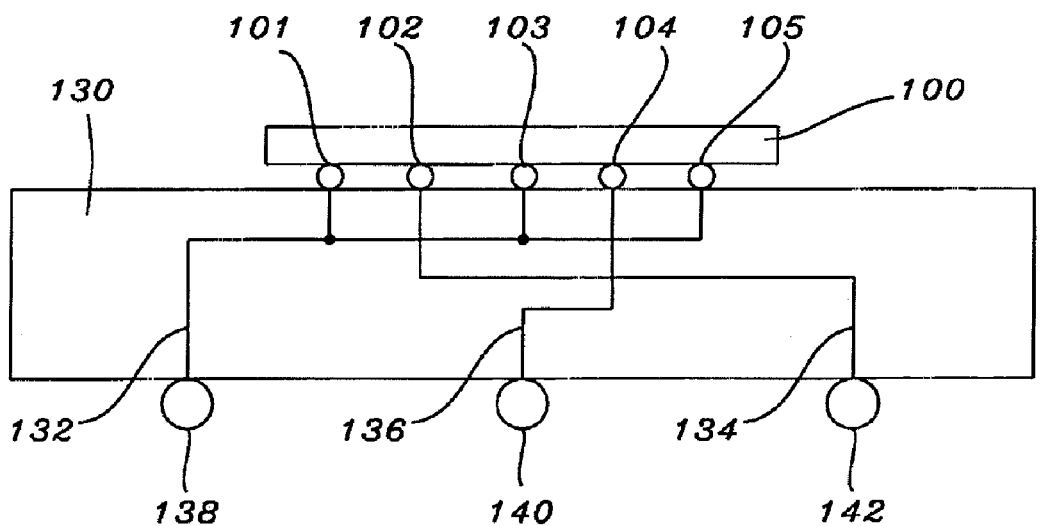
FIG. 11 shows detail regarding the usage of common power, ground and signal pads for BGA devices using the invention.

FIGS. 9 through 11 show further detail to demonstrate the concepts of BGA chip ball fan-out, pad relocation and the creation of common ground, power and signal pads.

FIG. 9 shows a cross section 100 of a BGA chip, five balls 101 through 105 are also shown. By using the BGA substrate 106 and the wiring 107 within the substrate 106, it is clear that ball 101 can be repositioned to location 111, ball 102 to location 112, etc. for the remaining solder bumps 103 through 105. It is clear that the separation of contact points 111 through 115 is considerably larger than the separation of the original solder bumps 101 through 105. The BGA substrate 106 is the subject of the invention, this substrate allows for spreading the distance between the contact points or balls of the BGA device to a considerable degree.

FIG. 10 shows the concept of pad relocation. BGA pad 120 can be any of the contact balls 101 through 105. By using the BGA substrate 130 and the wiring 131 that is provided within the substrate, it is clear that the BGA pads can be arranged in a different and arbitrary sequence that is required for further circuit design or packaging. For instance contact point 101, which is on the far left side of the BGA device 100, is re-routed to location 121 which is on the second far right of the BGA substrate 130. The re-arrangements of the other BGA solder bumps can readily be learned from following the wiring 130 within the substrate 131 and by tracing from solder bump to one of the contact points 122 through 125 of the BGA substrate.

FIG. 11 shows the interconnecting of BGA device solder bumps into common power, ground or signal pads. The BGA chip 100 is again shown with five solder bumps 101 through 105. The BGA substrate 130 contains a wiring scheme that contains in this example three wiring units, one for each for the power, ground and signal bumps of the BGA device. It is clear from FIG. 11 that wire arrangement 132 connects BGA device solder bumps 101, 103 and 105 to interconnect point 138 of the BGA substrate 130. It can further be seen that BGA device solder bump 104 is connected to interconnect point 140 of the BGA substrate by means of the wire arrangement 136, while BGA device solder bump 102 is connected to interconnect point 142 of the BGA substrate by means of the wire arrangement 134. The number of pins required to interconnect the BGA device 100 is in this manner reduced from five to three. It is clear that for more BGA device solder bumps, as is the case for an actual BGA device, the numeric effect of the indicated wiring arrangement is considerably more beneficial.

The concept of pad relocation can be realized using the metal interconnection scheme described in this invention, to replace the function of BGA substrate 130. From FIGS. 10 and 11 it can be seen that the extended functionality and extended wiring ability that are provided by the interconnect wiring schemes that are typically created in the BGA substrate 130 can be created using the method of the invention, on device 100. Some of the methods and possibilities of interconnect line routing that can be implemented using the method of the invention are highlighted in the following paragraphs.

Fan-out capability can be provided by the invention, using the metal conductors within the openings through the insulating layer and through the passivation layer that connect electrical contact pads of the top metallization structure with contact points of the interconnecting metallization structure. Each of the electrical contact points of the interconnecting metallization structure is connected directly and sequentially with at least one electrical contact point of the top metallization structure. In a fan-out scheme, the distance between electrical contact points of the top metallization structure is larger than the distance between electrical contact points of the interconnecting metallization structure by a measurable amount.

The number of electrical contact pads of the upper metallization structure can exceed the number of contact points of the interconnecting metallization structure by a considerable amount.

Pad relocation may also be accomplished by the method of the invention. Electrical contact points of the top metallization structure are connected with the contact points of the interconnecting metallization structure, directly but not necessarily sequentially, thereby creating a pad relocation effect. In this method, the distance between electrical contact points of the top metallization structure is larger than the distance between the electrical contact point of the interconnecting metallization structure by a measurable amount.

A reduction effect may also be accomplished by the method of the invention, wherein common nodes are connected together. Electrical contact points on a top surface of the top metallization structure are connected with contact points of the interconnecting metallization structure, where fewer contact points are used in the top metallization structure, since functionally equivalent contact points in the interconnecting metallization structure are connected together.

That is, the number of contact points for a particular electrical function among the electrical contact points of the top metallization structure is smaller than the number of electrical contact points of the interconnecting metallization structure by a measurable amount.

Some of the advantages of the present invention are:

1) improved speed of the IC interconnections due to the use of wider metal lines (which results in lower resistance) and thicker dielectrics between the interconnecting lines (which results in lower capacitance and reduced RC delay). The improved speed of the IC interconnections results in improved performance of High Performance IC's.

2) an inexpensive manufacturing process since there is no need for expensive equipment that is typically used in sub-micron IC fabrication; there is also no need for the extreme clean room facilities that are typically required for sub-micron manufacturing.

3) reduced packaging costs due to the elimination of the need for redundant I/O and multiple power and ground connection points that are needed in a typical IC packaging.

4) IC's of reduced size can be packaged and inter-connected with other circuit or system components without limiting the performance of the IC's.

5) since dependence on ultra-fine wiring is reduced, the use of low resistance conductor wires is facilitated.

6) structures containing more complicated IC's can be created because the invention allows for increased I/O pin count.

7) more complicated IC's can be created without the need for a significant increase in re-distribution of package I/O connections.

8) power buses and clock distribution networks are easier to integrate within the design of IC's.

9) future system-on-chip designs will benefit from the present invention since it allows ready and cost effective interconnection between functional circuits that are positioned at relatively large distances from each other on the chip.

10) form the basis for a computer based routing tool that automatically routes interconnections that exceed a pre-determined length in accordance with the type of interconnection that needs to be established.

11) provide a means to standardize BGA packaging.

12) be applicable to both solder bumps and wirebonding for making further circuit interconnects.

13) provide a means for BGA device solder bump fan-out thereby facilitating the packing and design of BGA devices.

14) provide a means for BGA device pad relocation thereby providing increased flexibility for the packing and design of BGA devices.

15) provide a means for common BGA device power, ground and signal lines thereby reducing the number of pins required to interconnect the BGA device with the surrounding circuits.

16) provide a means for more relaxed design rules in designing circuit vias by the application of small passivation (0.1 micrometers or more) vias.

17) provide the means for extending a fine-wire interconnect scheme to a wide-wire interconnect scheme without the need to apply a passivation layer over the surface of the fine-wire structure.

Although the preferred embodiment of the present invention has been illustrated, and that form has been described in detail, it will be readily understood by those skilled in the art that various modifications may be made therein without departing from the spirit of the invention or from the scope of the appended claims.

What is claimed is:

1. A semiconductor chip comprising:
a silicon substrate;
a transistor in or on said silicon substrate;
a metallization structure over said silicon substrate, wherein said metallization structure comprises a first metal layer and a second metal layer over said first metal layer;
a dielectric layer between said first and second metal layers;
a passivation layer over said metallization structure and over said dielectric layer, wherein a first opening in said passivation layer is over a first contact point of said metallization structure, and said first contact point is at a bottom of said first opening, wherein said passivation layer comprises a nitride;
a first polymer layer on said passivation layer, wherein a second opening in said first polymer layer is over said first contact point, wherein said first polymer layer has a thickness between 2 and 50 micrometers;
a third metal layer on said first polymer layer and on said first contact point, wherein said third metal layer comprises a titanium-containing layer with a thickness between 0.01 and 3 micrometers on said first polymer layer and on said first contact point, a gold seed layer with a thickness between 0.05 and 3 micrometers on said titanium-containing layer, and an electroplated gold layer with a thickness between 2 and 100 micrometers on said gold seed layer; and
a second polymer layer on said third metal layer and on said first polymer layer.

2. The semiconductor chip of claim 1, wherein said titanium-containing layer comprises a titanium-tungsten-alloy layer on said first polymer layer and on said first contact point.

3. The semiconductor chip of claim 1, wherein said titanium-containing layer comprises a titanium-nitride layer on said first polymer layer and on said first contact point.

4. The semiconductor chip of claim 1, wherein said first polymer layer comprises polyimide.

5. The semiconductor chip of claim 1, wherein said first polymer layer comprises benzocyclobutene (BCB).

6. The semiconductor chip of claim 1, wherein a third opening in said second polymer layer is over a second contact point said third metal layer, and said second contact point is at a bottom of said third opening, wherein said second contact point is connected to said first contact point through said third metal layer.

7. The semiconductor chip of claim 1, wherein said passivation layer further comprises an oxide.

8. A semiconductor chip comprising:
a silicon substrate;
a transistor in or on said silicon substrate;
a metallization structure over said silicon substrate, wherein said metallization structure comprises a first metal layer and a second metal layer over said first metal layer;
a dielectric layer between said first and second metal layers;
a passivation layer over said metallization structure and over said dielectric layer, wherein a first opening in said passivation layer is over a first contact point of said metallization structure, and said first contact point is at a bottom of said first opening, wherein said passivation layer comprises a nitride;
a third metal layer over said passivation layer and on said first contact point, wherein said third metal layer comprises a titanium-containing layer with a thickness between 0.01 and 3 micrometers over said passivation layer and on said first contact point, a gold seed layer with a thickness between 0.05 and 3 micrometers on said titanium-containing layer, and an electroplated gold layer with a thickness between 2 and 100 micrometers on said gold seed layer; and a polymer layer on said third metal layer and over said passivation layer.

9. The semiconductor chip of claim 8, wherein said titanium-containing layer comprises a titanium-tungsten-alloy layer over said passivation layer and on said first contact point.

10. The semiconductor chip of claim 8, wherein said titanium-containing layer comprises a titanium-nitride layer over said passivation layer and on said first contact point.

11. The semiconductor chip of claim 8, wherein a second opening in said polymer layer is over a second contact point of said third metal layer, and said second contact point is at a bottom of said second opening, wherein said second contact point is connected to said first contact point through said third metal layer.

12. The semiconductor chip of claim 8, wherein said passivation layer further comprises an oxide.

13. A semiconductor chip comprising:
a silicon substrate;
a transistor in or on said silicon substrate;
a metallization structure over said silicon substrate, wherein said metallization structure comprises a first metal layer and a second metal layer over said first metal layer;
a dielectric layer between said first and second metal layers;
a passivation layer over said metallization structure and over said dielectric layer, wherein a first opening in said passivation layer is over a first contact point of said metallization structure, and said first contact point is at a bottom of said first opening, wherein said passivation layer comprises a nitride;
a polymer layer on said passivation layer, wherein said polymer layer has a thickness between 2 and 50 micrometers; and
a third metal layer on said polymer layer and on said first contact point, wherein said third metal layer comprises a copper seed layer with a thickness between 0.05 and 3 micrometers over said polymer layer and over said first contact point, an electroplated copper layer with a thickness between 2 and 100 micrometers on said copper seed layer, and a nickel-containing layer over said electroplated copper layer, wherein said third metal layer is configured for wirebonding.

14. The semiconductor chip of claim 13, wherein said third metal layer further comprises a titanium-containing layer under said copper seed layer, on said first contact point and on said polymer layer, wherein said titanium-containing layer has a thickness between 0.01 and 3 micrometers.

15. The semiconductor chip of claim 13, wherein said third metal layer further comprises a titanium-nitride layer under said copper seed layer, on said first contact point and on said polymer layer, wherein said titanium-nitride layer has a thickness between 0.01 and 3 micrometers.

16. The semiconductor chip of claim 13, wherein said third metal layer further comprises a chromium-containing layer under said copper seed layer, on said first contact point and on said polymer layer, wherein said chromium-containing layer has a thickness between 0.01 and 3 micrometers.

17. The semiconductor chip of claim 13, wherein said passivation layer further comprises an oxide.

18. The semiconductor chip of claim 13, wherein said polymer layer comprises polyimide.

19. The semiconductor chip of claim 13, wherein said polymer layer comprises benzocyclobutene (BCB).

20. The semiconductor chip of claim 13, wherein a second opening in said passivation layer is over a second contact point of said metallization structure, and exposes said second contact point is at a bottom of said second opening, wherein said third metal layer is further on said second contact point, wherein said first contact point is connected to said second contact point through said third metal layer.

21. A semiconductor chip comprising:
a silicon substrate;
a transistor in or on said silicon substrate;
a metallization structure over said silicon substrate, wherein said metallization structure comprises a first metal layer and a second metal layer over said first metal layer;
a dielectric layer between said first and second metal layers;
a passivation layer over said metallization structure and over said dielectric layer, wherein a first opening in said passivation layer is over a first contact point of said metallization structure, and said first contact point is at a bottom of said first opening, wherein a second opening in said passivation layer is over a second contact point of said metallization structure, and said second contact point is at a bottom of said second opening, wherein said first opening has a width between 0.5 and 3 micrometers, wherein said passivation layer comprises a nitride; and
a third metal layer on said passivation layer and on said first and second contact points, wherein said first contact point is connected to said second contact point through said third metal layer, wherein there is no polymer layer between said third metal layer and said passivation layer, wherein said third metal layer comprises an adhesion layer, a copper seed layer on said adhesion layer, and an electroplated copper layer with a thickness between 2 and 100 micrometers on said copper seed layer, wherein said third metal layer is configured for wirebonding.

22. The semiconductor chip of claim 21, wherein said passivation layer further comprises an oxide.

23. The semiconductor chip of claim 21, wherein said electroplated copper layer is capped with nickel.

24. The semiconductor chip of claim 21 further comprising a polymer layer on said third metal layer and over said passivation layer.

* * * * *